US006406636B1

United States Patent
Vaganov

(10) Patent No.: US 6,406,636 B1
(45) Date of Patent: Jun. 18, 2002

(54) METHODS FOR WAFER TO WAFER BONDING USING MICROSTRUCTURES

(75) Inventor: Vladimir I. Vaganov, Los Gatos, CA (US)

(73) Assignee: MegaSense, Inc., Sunnyvale, CA (US)

( * ) Notice: Subject to any disclaimer, the term of this patent is extended or adjusted under 35 U.S.C. 154(b) by 0 days.

(21) Appl. No.: 09/324,342

(22) Filed: Jun. 2, 1999

(51) Int. Cl.⁷ .................................................. B81C 1/00
(52) U.S. Cl. .............................. 216/2; 216/33; 216/36; 216/39; 216/46; 216/65; 216/67; 216/52; 216/83
(58) Field of Search ................................ 216/2, 33, 34, 216/35, 36, 39, 46, 52, 65, 67, 83

(56) References Cited

U.S. PATENT DOCUMENTS

| | | | |
|---|---|---|---|
| 2,355,949 A | | 8/1944 | Boutwell ........................ 154/2 |
| RE29,524 E | * | 1/1978 | Spencer ......................... 216/34 |
| 5,290,333 A | | 3/1994 | Nied et al. ...................... 65/31 |
| 5,589,083 A | | 12/1996 | Ahn et al. ..................... 216/24 |
| 5,665,249 A | * | 9/1997 | Burke et al. ................... 216/33 |
| 5,759,418 A | * | 6/1998 | Frater et al. .................... 216/22 |
| 5,804,086 A | * | 9/1998 | Bruel ............................ 216/33 |
| 5,871,657 A | * | 2/1999 | Nelson .......................... 216/34 |
| 5,923,952 A | * | 7/1999 | Ismail et al. ................... 438/52 |
| 5,935,430 A | * | 8/1999 | Craig ..................... 210/198.12 |
| 6,093,330 A | * | 7/2000 | Chong et al. ................... 216/2 |
| 6,150,275 A | * | 11/2000 | Cho et al. ....................... 216/2 |
| 6,156,215 A | * | 12/2000 | Shimada et al. ............... 216/11 |

FOREIGN PATENT DOCUMENTS

JP 61-191038 A * 8/1986 .................. 216/34

* cited by examiner

*Primary Examiner*—Anita Alanko
(74) *Attorney, Agent, or Firm*—Skjerven Morrill MacPherson LLP; Norman R. Klivans

(57) ABSTRACT

Wafer-to-wafer bonding using, e.g., solder metal bonding, glass bonding or polymer (adhesive) bonding is improved by profiling one or both of the wafer surfaces being bonded to define microstructures therein. Profiling means providing other than the conventional planar bonding surface to define cavities therein. The bonding material fills the cavities in the microstructures. For instance, a system of ridges and trenches (e.g. in cross-section vertical, slanted, key-holed shaped, or diamond-shaped) are microstructures that increase the surface area of the wafers to which the bonding material can adhere. Use of the key-hole shaped or diamond-shaped profile having a negative slope at the trench interior substantially increases the bonding force. Where electrical leads feed through a bond, the seal to the bond at that point is improved by either using lengthened feedthroughs which extend the length of a substantial portion of the bond or by use of doped (diffused) conductive wafer regions rather than metallized feedthroughs. In some cases the bonded surfaces include spacers which define a precisely defined distance between the two wafers, thus providing an exactly specified thickness of the bonding material. In some cases the edges of the bonded assembly are sealed by a sealant which extends through narrow capillary spaces between the two bonded wafers, thus hermetically sealing together the two wafers.

50 Claims, 37 Drawing Sheets

METHODS FOR WAFER TO WAFER BONDING USING MICROSTRUCTURES

FIELD OF THE INVENTION

This invention relates to integrated circuits, microsensors, and micromachining, and more particularly to bonding of silicon or other wafers.

DESCRIPTION OF THE RELATED ART

The need for wafer-to-wafer, for example silicon-to-silicon, bonding has been known for years. In micromachining technology several known bonding approaches can be divided into several groups depending on the bonding material and physics of the process, as shown in FIG. 1. For silicon-to-silicon metal bonding, there are at least three major technologies: eutectic bonding, soldering and solid phase (deformation) welding which is similar to the well known thermo-compression wire bonding technique.

For glass as a bonding material, three major technologies are known: low temperature glass, glass frit bonding, anodic bonding and fusion bonding, which can be considered in this group because in the process of annealing the intermediate layer is of oxide (glass) nature.

For polymer bonding materials, along with various kinds of glues, the best known are negative photoresist, polyimids, epoxies and thermoplastic materials.

Depending on a specific application, one or another bonding material and technology can be used. In any case, bonding is intended to provide a certain level of bonding strength, which can be characterized by either pull or shear force required for delamination of the bonded wafers. Bonding also should provide a certain level of hermeticity (air tightness) or permeability and some other characteristics such as level of induced stress during bonding and maximum sustainable temperature.

A major goal for bonding is minimizing the bonded area on the surface of the wafer. This goal is derived from the general strategy of microelectronics technology: minimizing area minimizes the manufacturing cost. In many cases, especially in sensor applications, the bonding area can be comparable or even larger than the active area of the sensor or microelectronic device. Therefore, the need for decreasing this bonding area in order to decrease the cost of the IC or sensor die is clear.

Consider the cross section of the bonding area as shown in FIG. 2. Two wafers 1 and 7 are bonded together by associated bonding material layers 3 and 5. Layers 2 and 6 are interface surfaces between the wafers 1, 7 and the bonding material layers 3, 5. These surface layers 2, 6 have different physical properties compared to the wafers 1, 7 and the bonding material layers 3, 5 and characterize adhesion of the bonding material to the wafer surface. One can assign different values of mechanical strength, hermeticity and permeability to these various layers. Layer 4 is the interface surface between the two bonding material layers 3, 5 and is a result of how homogenous the bonding material is on the bonding interface 4 after the bonding process. If the bonding material is deposited only on one wafer, e.g. wafer 1, then the structure is simpler and layer 4 does not exist.

The quality of bonding is characterized by two parameters: pull or shear strength or force, S; hermeticity and permeability to different substances, H. As shown in FIG. 2, the quality of the bonding depends on the properties of all the layers 1 to 7 and on the geometry of the bonding area. Usually, as in the case of silicon wafers (substrates), the strengths $S_1$, $S_7$ and hermeticities $H_1$, $H_7$ of respectively the bonding wafers 1, 7 are greater than the corresponding parameters $S_3$, $S_5$ and $H_3$, $H_5$ of the bonding material layers 3, 5. ($S_1$ refers to the force S for layer 1, etc.). Furthermore, the strength and hermeticity properties of the bonding material layers 3, 5 are usually better than the properties of intermediate layers 2 and 6. Therefore, in most cases the following inequalities apply:

$$S_1 = S_7 > S_3 = S_5 > S_2 = S_6,$$

and $$H_1 = H_7 > H_3 = H_5 > H_2 = H_6.$$

Ideally the properties of all the layers are the same. In this case the bonded structure is monolithic as shown in FIG. 3, and the strength and hermeticity are the highest possible and determined only by the surface area (in two dimensions) of the bonding area having width w.

As mentioned before, there is an economic reason to decrease the bonding area. With any given length of the bonding stripe, this area is proportional to its width w. Therefore, minimizing width w for required strength and hermeticity of the bond is one of the goals of bonding technology. It is clear, however, that there are some physical and technological limits on width w and t, where t is the other (thickness) dimension of the bonding area.

In case of an ideal bonding material (see FIG. 3) these dimensions w, t are determined by required pull and shear force applied to the bonding joint. Consider a sensor or IC die consisting of two chips each with the dimensions 2×2× 0.5 mm bonded together. Suppose that this bonding is intended to survive a 2000 g shock. Assuming that one of the chips will be pulled apart by the acceleration force at 2000 g, one can calculate that this force is 0.1 N. If one also assumes that the length 1 of the bonding stripe is 5 mm, then it is easy to show that the width w of the bonding stripe made from the same monolithic material might be less than 0.1 μm in order to withstand breaking stress. As one can see, this is much smaller than can be achieved with present processes. Therefore, the mechanical strength of an ideal bond does not limit reducing the bonding area. In addition, the minimal limit for width w is also determined by permeability of a thin layer of silicon (the wafer material). It is known that a silicon diaphragm thinner than 10 μm is not truly hermetic with respect to the helium. Therefore, this value can be considered as a physical limit for silicon wafer material if true hermeticity is required.

In a real situation (see FIG. 2) the quality of bonding is determined mostly by the properties of layers 2 and 6 from both the mechanical and hermetical points of view and in general is proportional to the width w of the bonding stripe. This general rule is in direct contradiction to the goal of reducing bonding area.

SUMMARY

This invention is directed to decreasing bonding area on the wafer and increasing mechanical strength and hermeticity of wafer-to-wafer bonding. This is achieved by one or more of the following: microprofiling the bonding area to decrease bonding area on the surface of the die without decreasing the active bonding surface area by forming at least the microstructure on the surface, increasing the bonding force and hermeticity by providing a larger bonding surface area, increasing the bonding force due to the partial substitution for pull force of shear force, and increasing uniformity of bonding by decreasing the stress induced during bonding. Microprofiling ("profiling") refers to, prior to bonding, micromachining the surface area of the wafer(s) to be bonded to define therein microstructures, e.g. ridges, trenches, pyramids, poles, cavities, etc.

These processes and the resulting structures are accomplished in various ways, including forming a negative slope on the side walls of microprofiled trenches; forming profiled bridges; forming a matching system of profiled trenches and ridges; forming a system of profiled hooks; forming a system of electrical output leads; forming metal leads in the profiled trenches and over the ridges; forming diffusion electrical feed unders; forming implantation or diffusion paths through the bridges; and profiling the ridges (opposing the trenches) to eliminate patterning on the bonding material.

Other pertinent processes and structures include forming spacers (profiled posts, ridges, etc.) to control the final thickness of the bonding material; forming barriers (additional ridges outside the bonding area) to limit the bonding area; limiting the spread of the bonding material in the process of its deposition; preventing particle contamination of the bonding area; creating a continuous surface on the side walls of the die along the bonding line for external hermetization by deposition of PECVD glass, for example; creating a continuous capillary space between the two wafers around the bonding area for external hermetization by liquid hermetic sealant, for example spin on glass; and protecting the die contact pads during external hermetic deposition.

A common principle here is the use of the third dimension—the thickness of the wafer—to decrease bonding surface area in the plane defined by the surface of the wafer but increase total bonding surface area and therefore increase mechanical strength and hermeticity of the bond.

Various materials are used for the bonding processes in accordance with this invention. A bonding process with profiled wafer surfaces in accordance with the invention in general includes several major steps: micromachining the bonding area (on one or both wafers) to define cavities therein; depositing bonding material on one or both of the wafer surface(s); processing of the deposited bonding material (by temperature, atmosphere, chemical treatment, etc.); patterning of the bonding layer; bonding during which the material fills in the cavities in the profiled surfaces; and in some cases hermetic sealing.

DETAILED DESCRIPTION

Micro-profiling the Bonding Area

Figure 1:
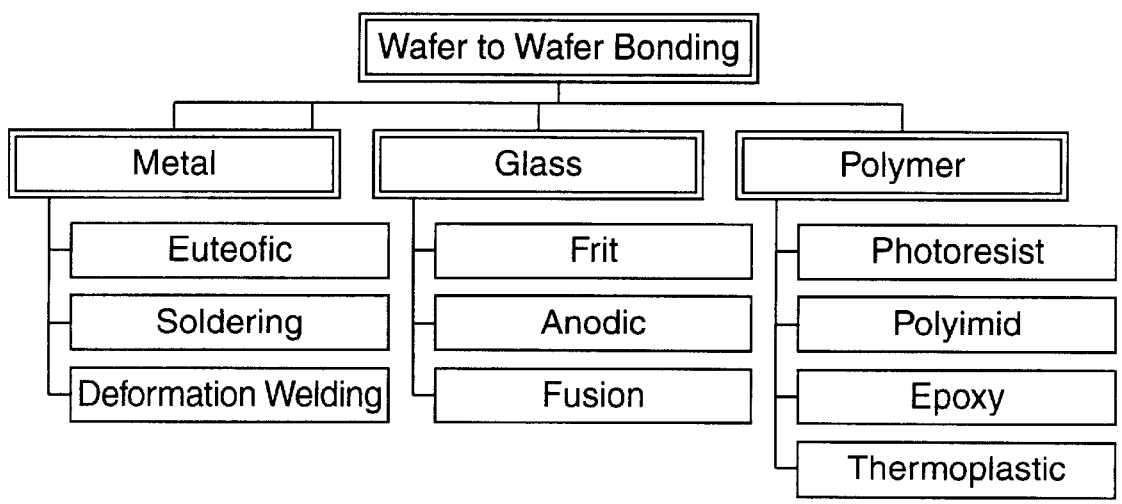
FIG. 1 shows, arranged by category, various wafer-to-wafer bonding techniques.
Figure 2:
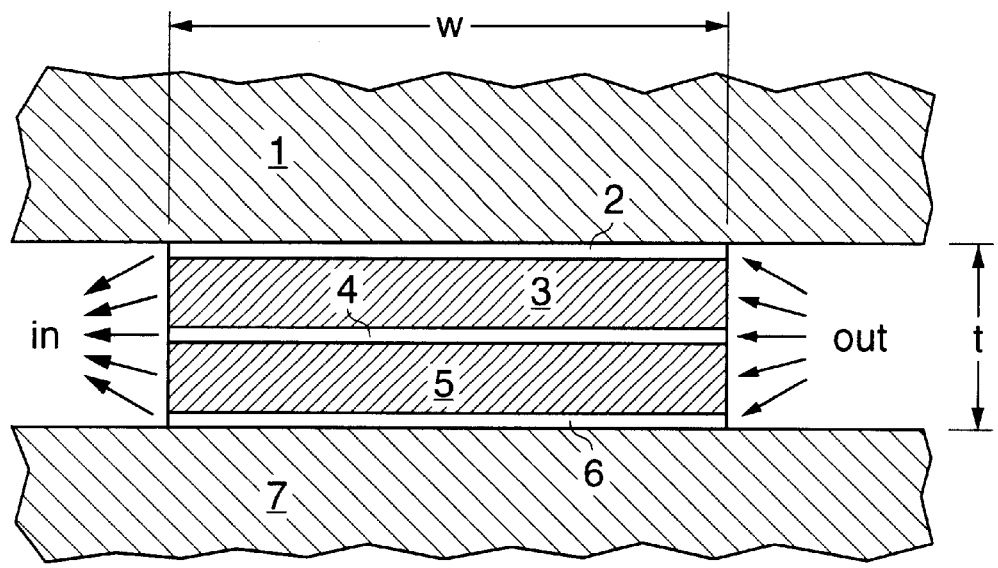
FIG. 2 shows conventional wafer-to-wafer bonding.
Figure 3:
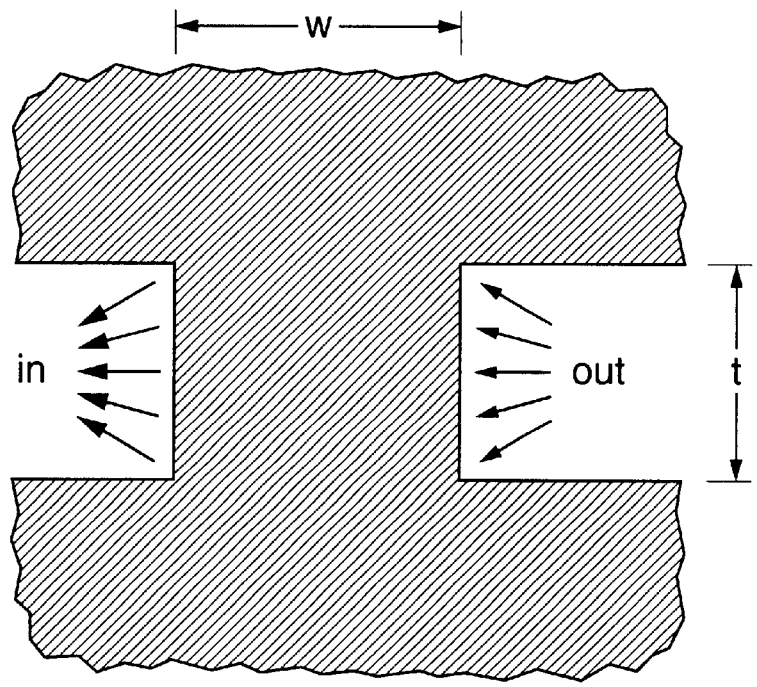
FIG. 3 shows an ideal wafer-to-wafer bonding formed by the same material as the initial wafers.
Figure 4:
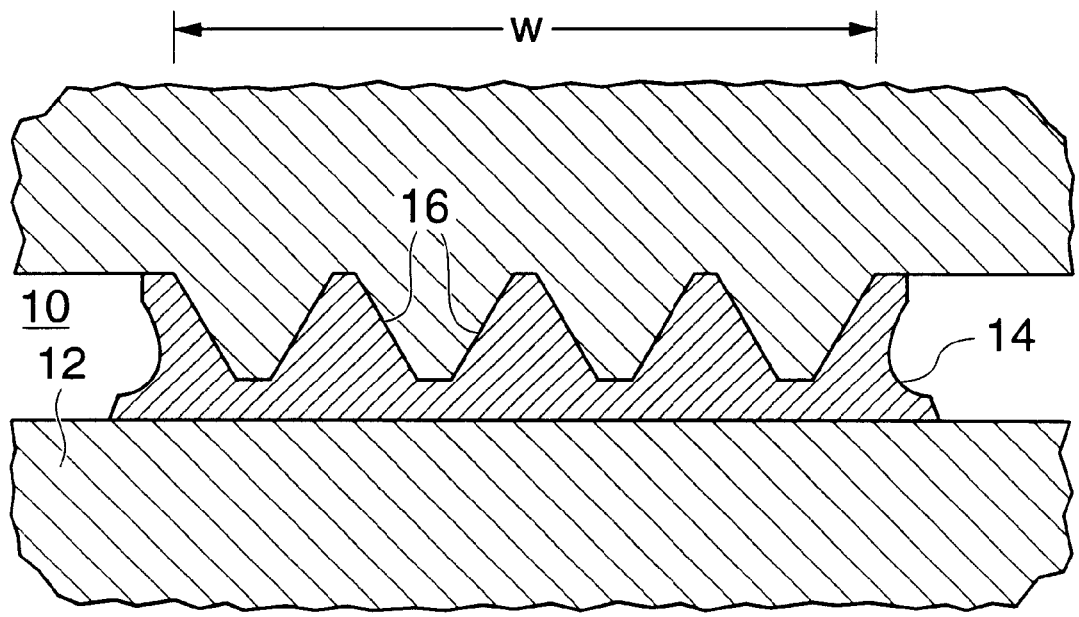
FIG. 4 shows wafer profiling with trenches and ridges for wafer-to-wafer bonding.
Figure 5:
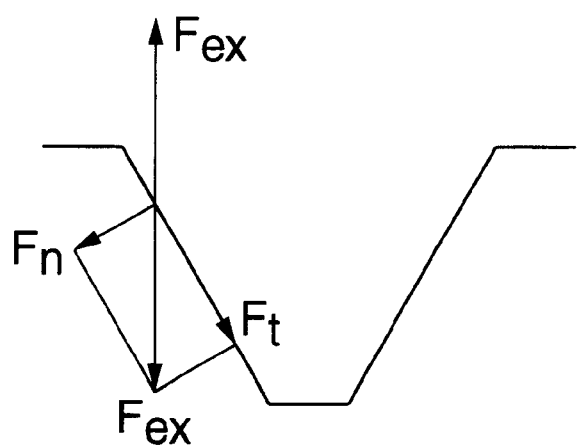
FIG. 5 is a force analysis of the FIG. 4 structure.

FIG. 4 illustrates in cross section a portion of a bonding area where the upper wafer 10 is profiled (ridged) in accordance with the invention. This is used when the lower wafer 12 is not profiled, e.g. due to design reasons. Like FIG. 2, FIG. 4 is not to scale and does not illustrate any of the actual microsensor or integrated circuit devices formed on either wafer 10 or 12, but merely illustrates a portion of the bonded area. (Typically, but not always, the microsensors or integrated circuit devices are formed prior to the wafer bonding.) The bonding material 14 fills in the cavities in the profiled microstructure, and is any one of those materials disclosed above. The active bonding area 16 is thus much larger than the planar area having width w on the planar surface of the wafer, due to the profiled ridges. For example, for silicon (100) crystalline orientation wafers, if this ridge profile is fabricated by anisotropic etching along crystalline <110>directions, the gain in the active bonding surface is about 1.7 w. This means that either one can decrease the bonding area more than 2 times with the same level of bonding strength, or increase the bonding strength more than 2 times for the same bonding area. The gain in pulling force is larger than the gain in the surface area because for the external pulling force $F_{ex}$ the normal pulling force $F_n$ applied to the side wall of the profiled surface will be 1.4 times smaller for this example, as shown in FIG. 5.

Therefore, for the same width w of the bonding area and the same external pulling force $F_{ex}$ for flat and profiled surfaces, the actual pulling force $F_n$ on the profiled surface 16 will be 2.4 times smaller. Of course, an additional tangential force $F_t$ is also applied to the bonding surface, but as a rule this shear force required to break the bond is several times larger than the normal pulling force.

The dimensions (depth, height, angle) of the ridges/trenches or other microstructures are not critical, but are determined by the associated etching processes and by design considerations. A typical depth of the trenches (or other microstructures) in wafer 10 in FIG. 4 is 5–15 $\mu$m; a typical microstructure width at the widest point is 5 $\mu$m; a typical minimum size would be 1 $\mu$m deep (or high) and 1 $\mu$m wide for any of the microstructures disclosed herein (this is however not limiting).

Figure 6:
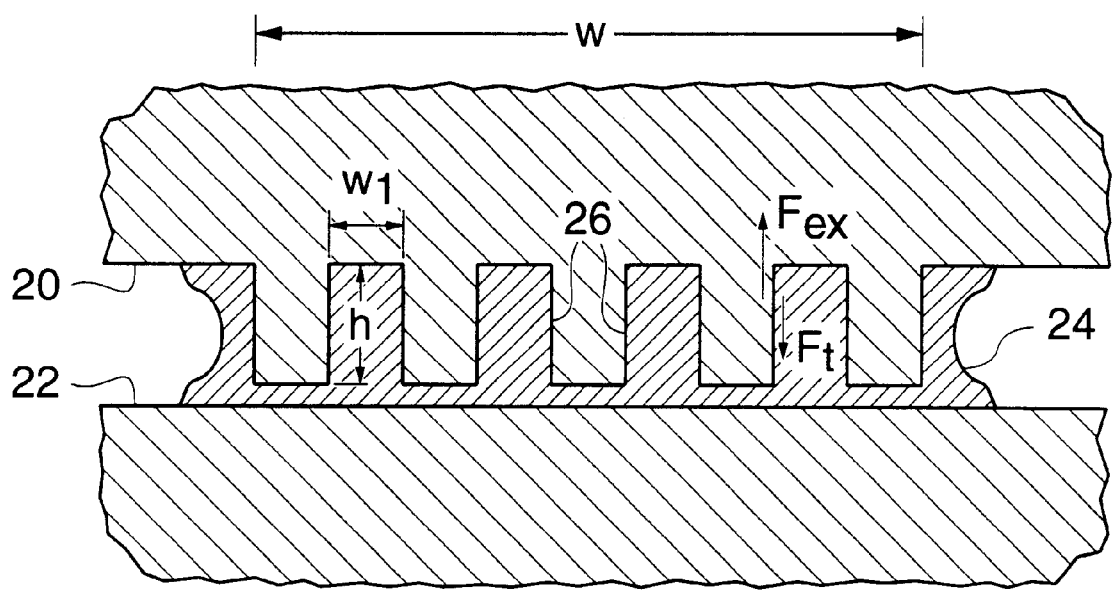
FIG. 6 shows profiling using vertical trenches and horizontal ridges one wafer for wafer-to-wafer bonding.

In the example shown in FIG. 6, here the upper wafer 20 profile defines trenches with vertical side walls, which can be achieved in different ways, for example by anisotropic etching of a (110) crystalline orientation silicon surface or RIE etching of any wafer orientation. The lower wafer 22 is bonded by bonding material 24 to upper wafer 20. In this case the depth of the trenches (or height of the ridges) is h and the width of trenches or ridges is $w_1$, so the gain in the active bonding surface area is $1+h/w_1$. Generally speaking, the aspect ratio of etched trenches is the minimal savings ratio in either bonding area or strength of the bond. The external pulling force characterizing the strength of the bond in this case additionally is increased because most of the active bonded area is subject to shear stress rather than tensile stress. As mentioned above, the shear breaking bond stress is usually several times larger than the tensile breaking bond stress produced by the pulling force.

Figure 7:
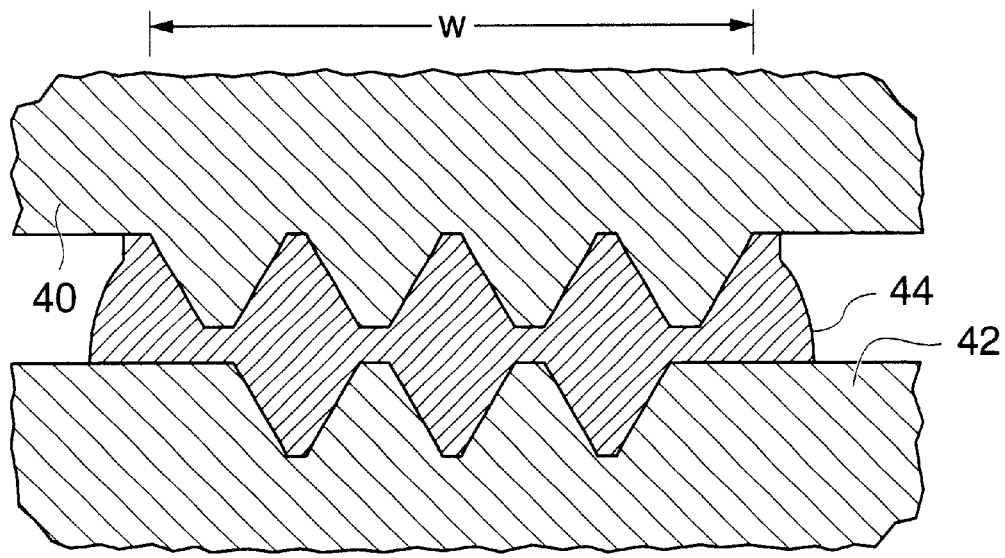
FIG. 7 shows a variation of the FIG. 4 bonding with profiling of both bonded wafers.
Figure 8:
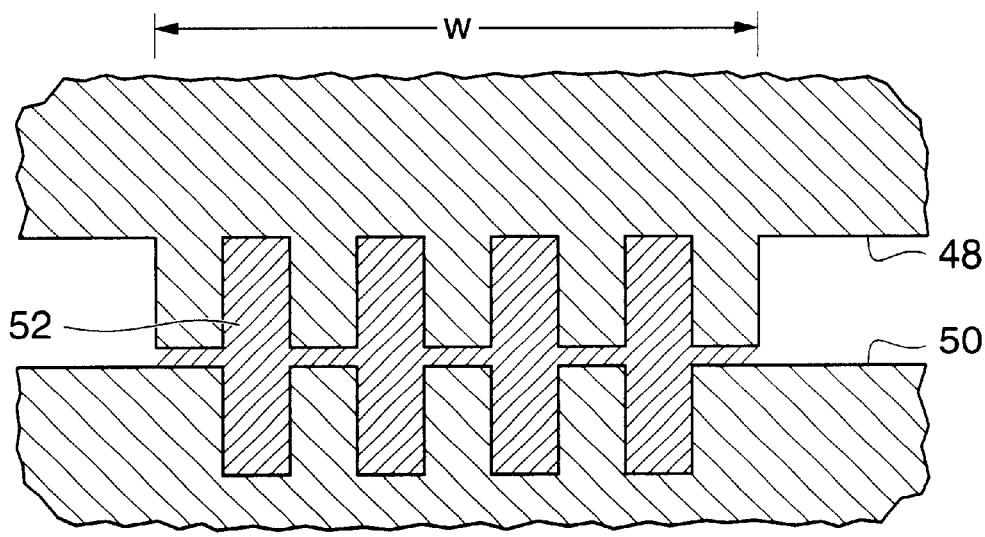
FIG. 8 shows a variation of the FIG. 6 bonding with profiling of both wafers.

FIGS. 7 and 8 illustrate a cross section of the bonding area where both wafers being bonded are profiled. In FIG. 7 the upper wafer 40 and the lower wafer 42 are profiled with trenches, where (100) silicon wafers 40, 42 are profiled by anisotropic etching. Both wafer 40, 42 surfaces provide better bonding in this case. FIG. 8 illustrates an arbitrary orientation of the wafers 48, 50 bonded by material 52, using RIE etching to define the profiled vertical trench.

Figure 9:
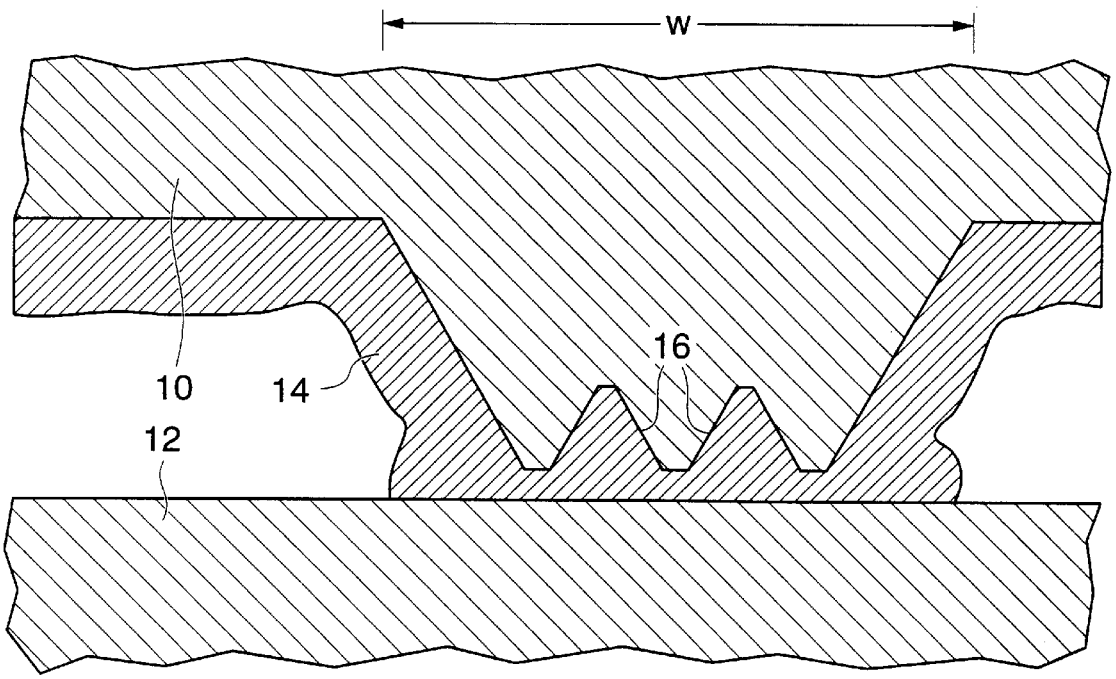
FIG. 9 shows bonding without patterning the bonding material in the bonding area.

In some cases, when the presence of bonding material in the cavities below the bonding ridges is not critical for the performance of the completed die structure, the profile of the ridges is used to pattern the bonding area (as shown in FIG. 9). The bonding then occurs only in the areas on the top of the ridges, so all the other bonding material deposited below the ridges does not participate in the bonding process. In this case there is no need for special stripe patterning of the bonding material in the bonding areas. This simplifies the bonding process and hence decreases cost.

Figure 10:
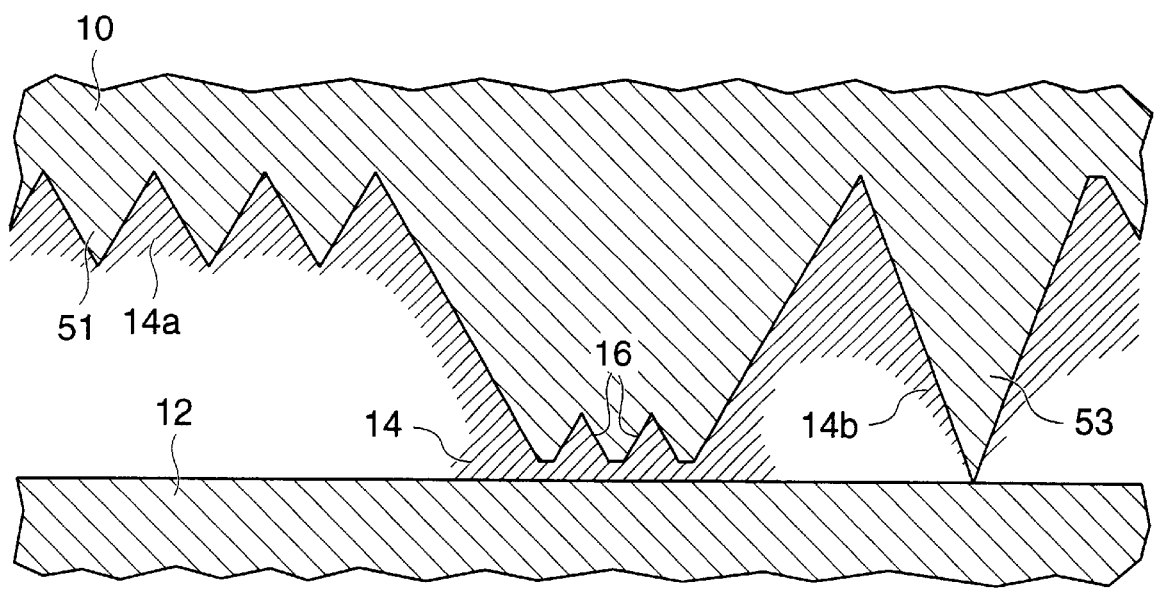
FIG. 10 shows a variation of the FIG. 9 bonding where the continuity of the bonding material inside and outside the bonding area is broken by the additional microprofiling of the surface.

Surface profiling of the bonding area decreases bonding area on the surface of the die without decreasing active bonding surface, increases the bonding force and hermeticity due to a larger bonding surface, increases the bonding force due to the partial substitution of pull force by shear force, increases uniformity of bonding, decreases the stress induced during bonding, and may eliminate the need for patterning of the bonding material for the bonding area.
Micro-profiling the Area Inside and Outside the Bonding Area In the embodiment of FIG. 9 (similar so FIG. 4), the presence of bonding material 14 in the cavity below the bonding ridges, although not affecting the performance of the completed die directly, can create problems with long term reliability because of potential danger of delamination due to insufficient adhesion, cracking or breakage. In all these cases the problems can be solved by micro-profiling this surface 51 as shown in FIG. 10. The shape of the resulting microstructure is e.g. arrays of ridges, trenches, pyramids, pits, holes, poles, waffle structures, etc. The micro-profiling serves several purposes. First, it increases the surface area and therefore improves adhesion. Second, it breaks the thickness continuity of the bonding material 14a and therefore decreases the stress (including thermo-mechanical) in this material, thereby preventing warpage, cracking and breakage.

Another potential problem is the wafer warpage after depositing of the bonding material, due to the difference in thermal expansion coefficients of the bonding wafer (silicon) and the bonding material. This creates problems with further wafer processing including lithography, alignment and the bonding itself. These problems are solved by micro-profiling the wafer between the dice and outside the bonding area for each die, as shown, for example, in FIG. 10 at 53. The additional ridges between the dice break the thickness continuity of the bonding material 14b and therefore decrease the stress (including thermo-mechanical stress) in this material preventing wafer warpage and breakage.

Negative Slope on the Side Walls of the Profiled Trenches

Figure 11A:
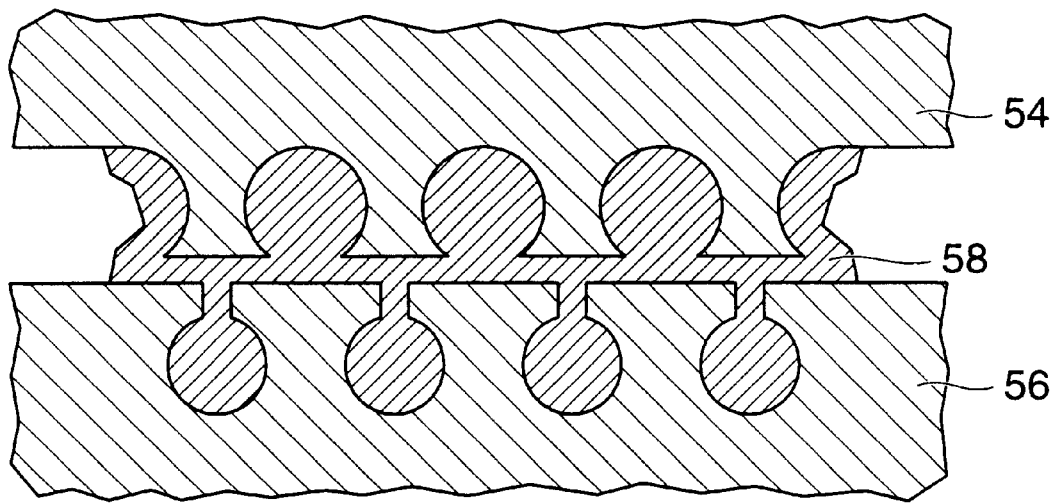
FIG. 11a shows profiling of both wafers using key-hole shapes.
Figure 11B:
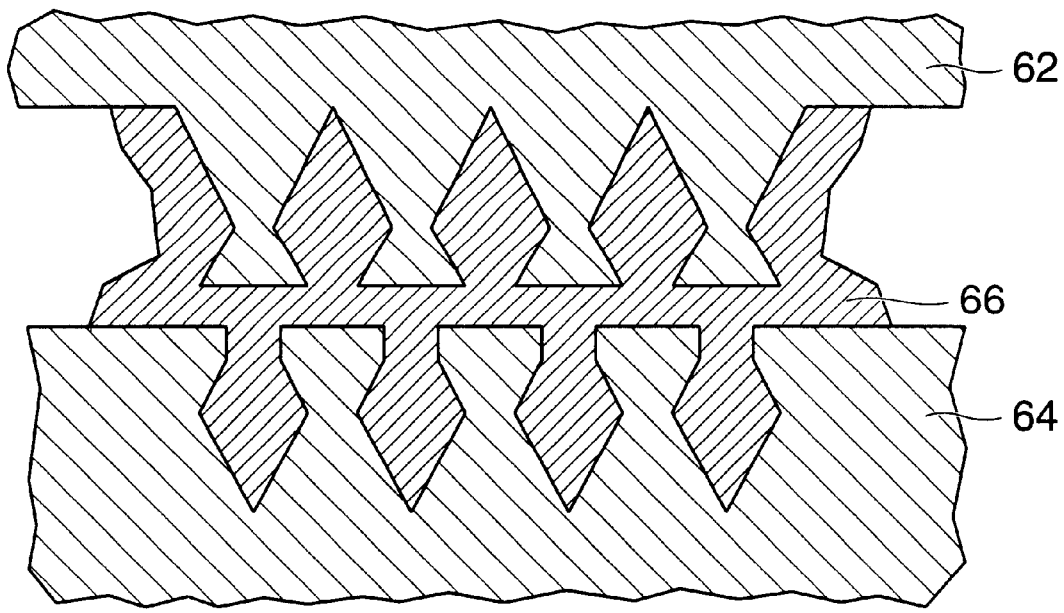
FIG. 11b shows profiling of both wafers using diamond-shaped key holes.

There are some cases where bonding material has very good mechanical properties for bonding to itself, but its adhesion to the surface of the underlying substrate is poor, or there is a need to further increase bonding strength. Then profiling with a negative slope of the side walls of the wafer trenches or ridges is used, as shown in cross-section in FIGS. 11a and 11b. Two slightly different types of profile for upper wafer 54 and lower wafer 56 (as above, these orientations refer only to that in the drawings and have no other significance) are shown in FIG. 11a with intervening bonding material 58. The profile of the ridges in wafer 54 can be formed either by plasma etching or a combination of RIE and isotropic etching. The keyhole profile of the trenches in wafer 56 can be achieved, for example, by a combination of RIE and isotropic plasma etching. Bonding material 58 fills in all the trenches on both wafers 54, 56 and after hardening works as a system of "anchors" holding the two wafers 54, 56 together with additional force besides pure adhesion of the bonding material 58 to the surface of the wafers 54, 56. FIG. 11b shows a similar arrangement with a diamond shape profile of wafers 62, 64, and intervening bonding material 66.

Figure 12:
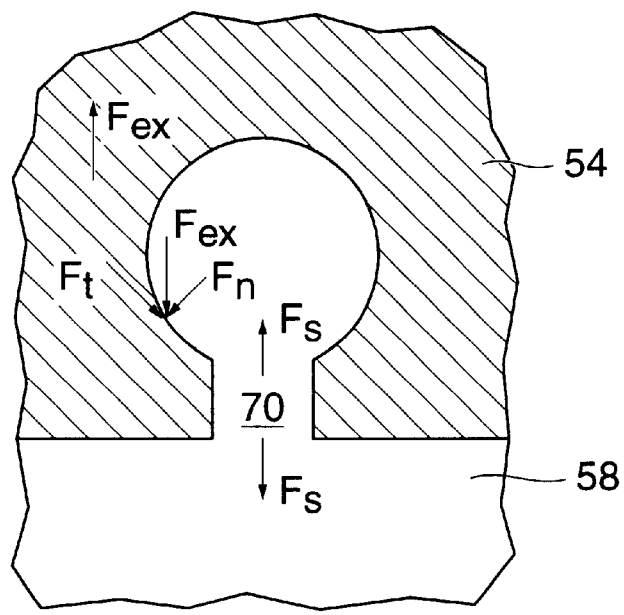
FIG. 12 is a force analysis of the FIG. 10 structure.
Figure 13:
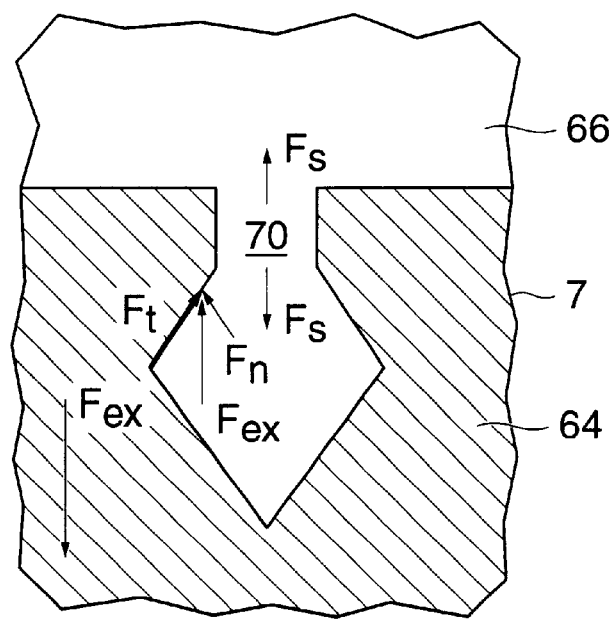
FIG. 13 is a force analysis of the FIG. 11 structure.

When an external pulling force $F_{ex}$ is applied to the wafers, then the normal to the surface pulling force $F_n$ applied to the side wall with the negative slope of the profiled surface and the shear force $F_t$ are as shown in FIGS. 12 and 13 showing a force analysis of relevant portions of respectively FIGS. 11a and 11b. As can be seen, on the negative slope of the trench side wall the normal force is compressive, which means that the connection of the bonding material to the wafer surface will be stronger and the bonding force will be determined also by the breaking tensile stress F of the bonding material in the "neck" 70 (narrow portion) of the trenches.

Bridges

Figure 14:
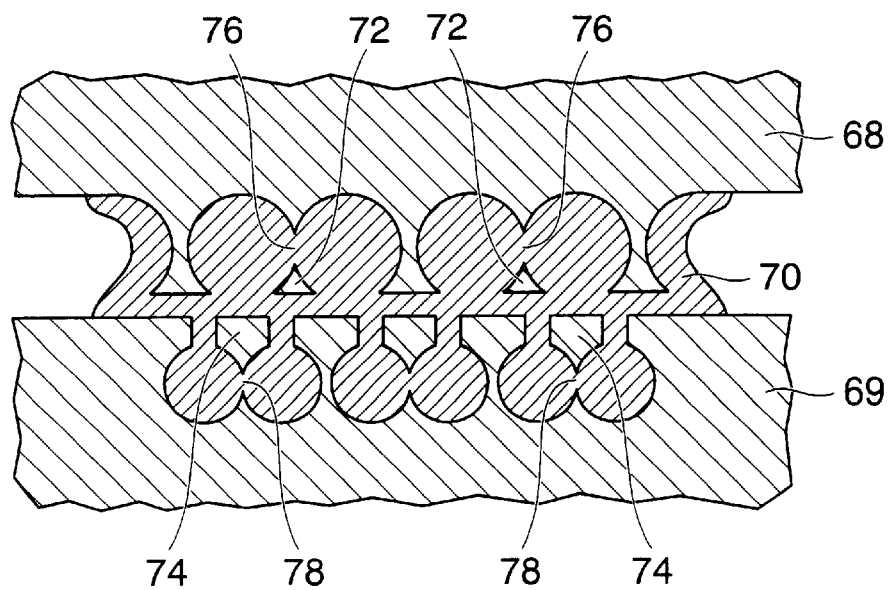
FIG. 14 shows a variation of the FIG. 10 structure with bridges between various of the profiled keyholes.
Figure 15:
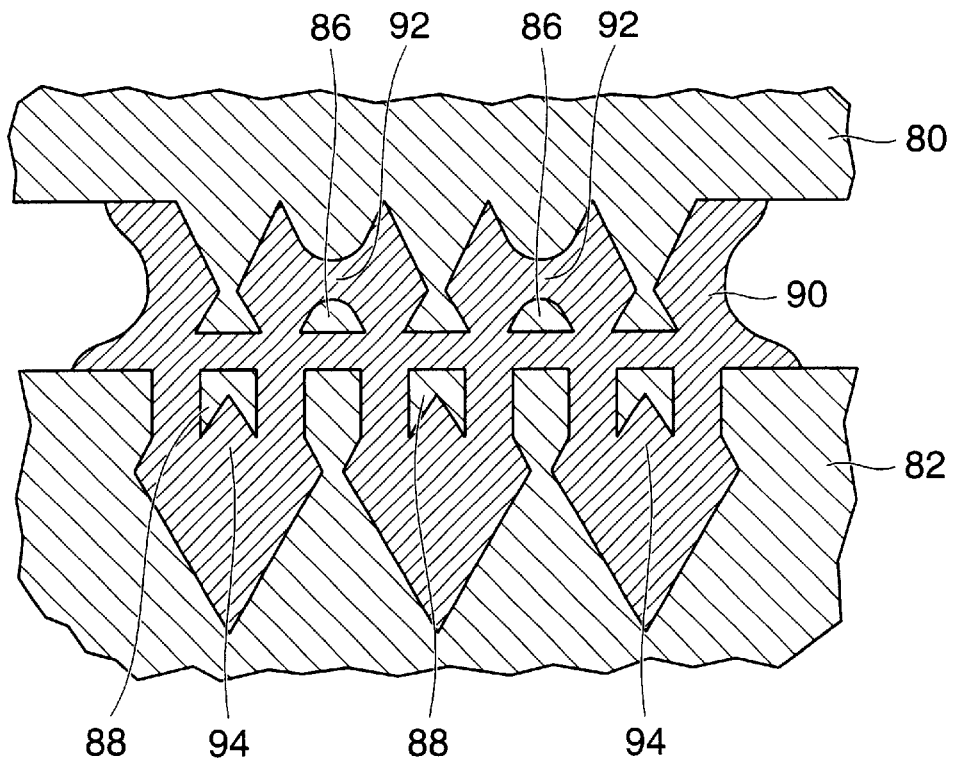
FIG. 15 shows a variation of the FIG. 11 structure with bridges between various of the profiled keyholes.

Another approach to increasing bonding strength with the same surface area on the surface of the wafers 68, 69 being bonded uses micro-bridges in the bonding area as illustrated in cross-section in FIG. 14. In FIG. 14 the bonding material 70 is connected beneath the bridges 72, 74 creating a set of "hooks" 76, 78 between the wafer bridges 72, 74 and hardened bonding material 70. (It is to be understood that bridges 72, 74 are connected to respectively the remainder of wafers 68, 69 outside of the plane of the figure). This additionally improves the bonding strength and reduces the effect of pulling and shear forces on the quality of adhesion between two surfaces and, therefore, on hermeticity. A similar structure, with different profiles, is shown in FIG. 15 with wafers 80, 82 having bridges 86, 388 defining bonding material 90 having hooks 92, 94.

Matching System of Trenches and Ridges

Figure 16:
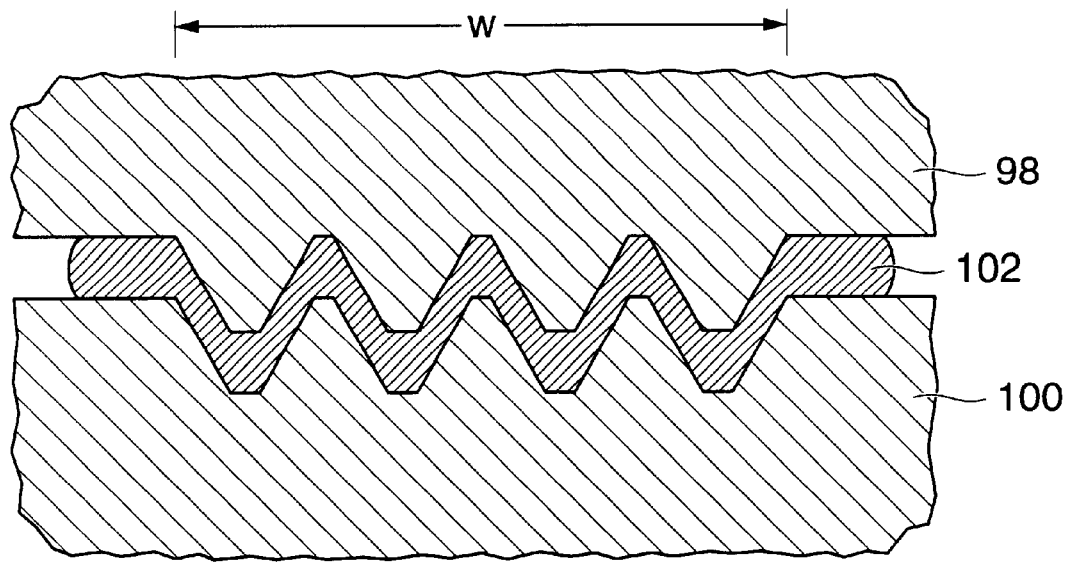
FIG. 16 shows matching trenches and ridges on the two wafers being bonded.
Figure 17:
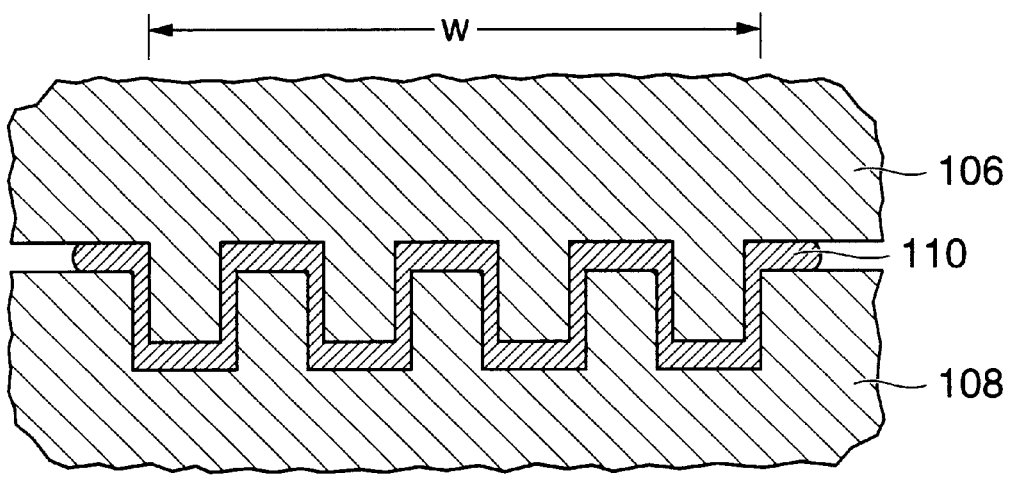
FIG. 17 shows matching vertical trenches and ridges on the two wafers being bonded.

Another bonding improvement is to fabricate a matching set of ridges on one wafer and a set of trenches on the other wafer. This is illustrated in both FIGS. 16 and 17 in cross-section in two similar examples. In this case the pulling force applied to the wafers 98,100 is transferred into shear force partially in FIG. 16 by a matching trench/ridge profile, with intervening bonding material 102. In FIG. 17, the pulling force applied to wafers 106, 108 is transferred completely into shear stress via intervening bonding material 110. As mentioned above, the maximum shear stress is several times higher than tensile (pulling) stress. The shear force applied to the wafers is transferred into compressive stress of bonding material between the side walls of the groves trenches.

Hooks

Figure 18:
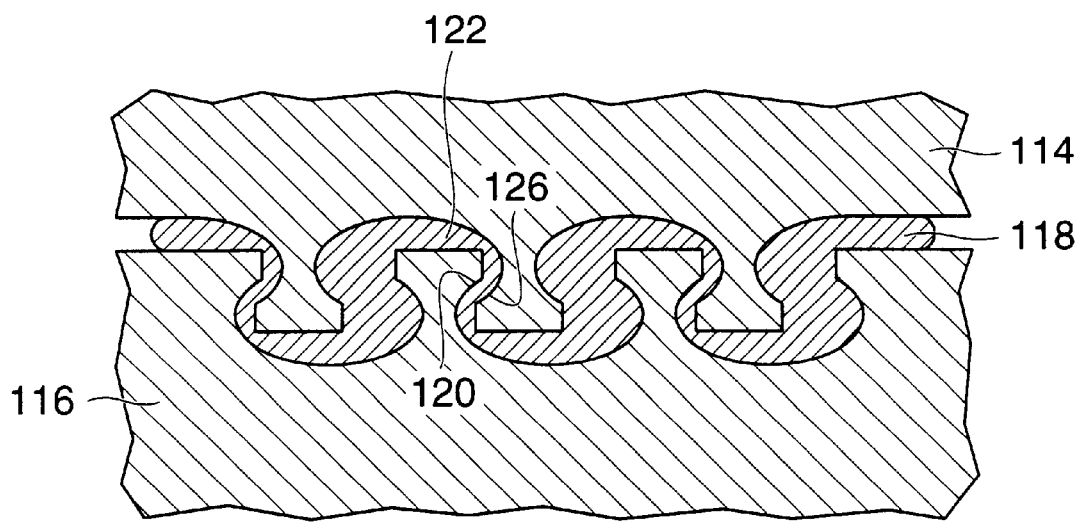
FIG. 18 shows a system of interlocking ridges on the two wafers being bonded.
Figure 19:
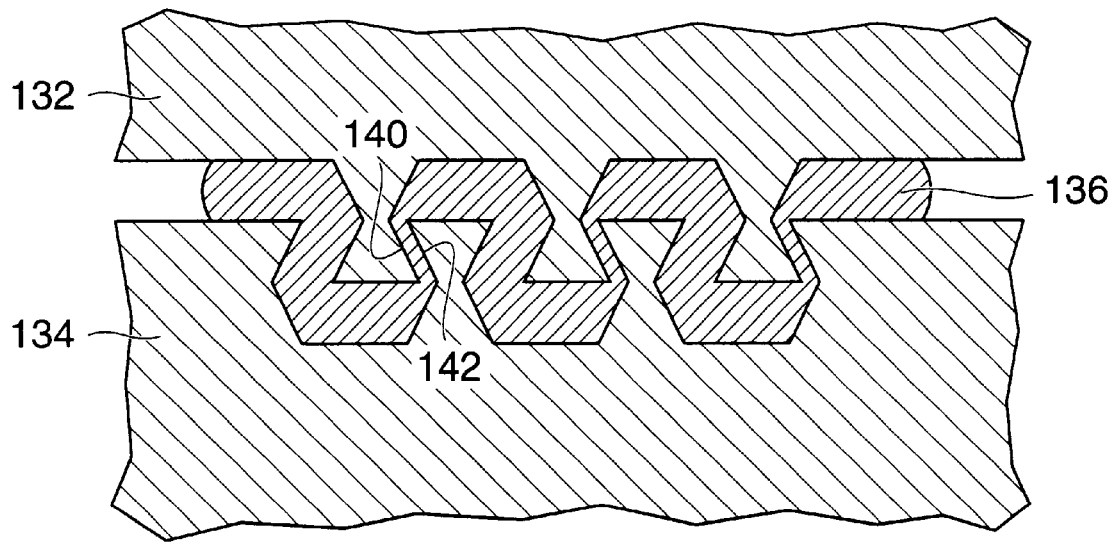
FIG. 19 shows a variation of the FIG. 18 structure.

A further improvement is to create a matching set of "hooks" from both of the bonded wafers, as shown in FIGS. 18 and 19. In FIG. 18, the wafers 114, 116 are aligned and the ridges 120 on wafer 116 are inserted into the trenches 122 on wafer 114, then next the wafers 114, 116 are either shifted or slightly rotated prior to bonding of bonding material 118, so that the hooks (ridges) 120, 126 are locked together. In this case the pulling force applied to the wafers creates compressive stress in the bonding material between the side walls of the ridges and trenches with negative slope. At the same time it creates tensile stress in the necks of the ridges but the strength of the initial material of the wafers is usually higher than of the bonding material. Therefore, the bonding strength is increased. A similar arrangement is shown in FIG. 19, with wafers 132, 134 bonded by bonding material 136, with "hooks" 140, 142.

Electrical Output Leads

In most applications of wafer bonding there is a need to form electrical outputs (leads) extending through the bonding area from inside to outside of the bonded die to carry electrical signals. Several ways to make such electrical connections are described hereinafter.

Metal in the Trenches and Over the Ridges

Figure 20:
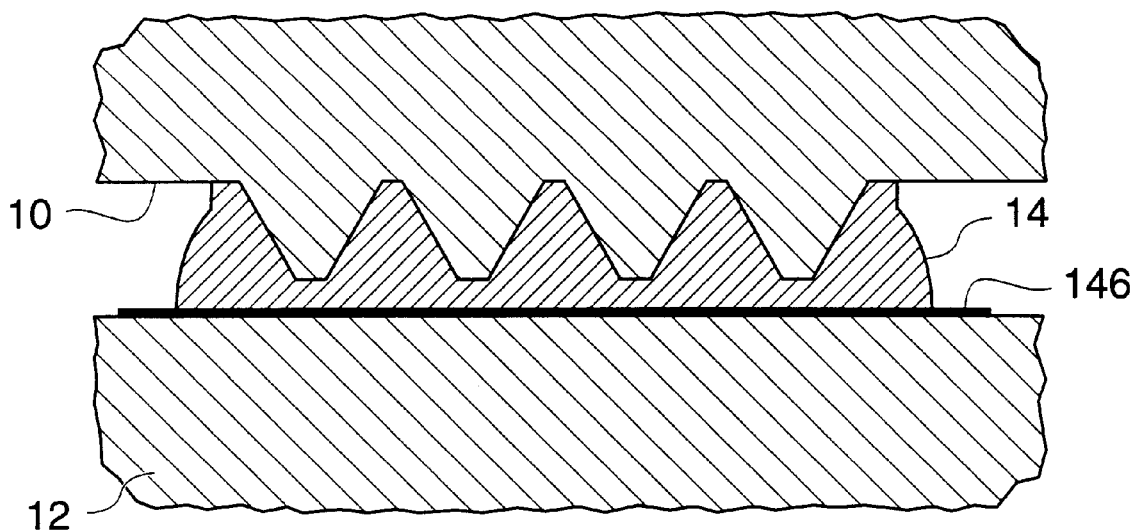
FIG. 20 shows a metallized feedthrough through a bond of the type shown in FIG. 4.
Figure 21:
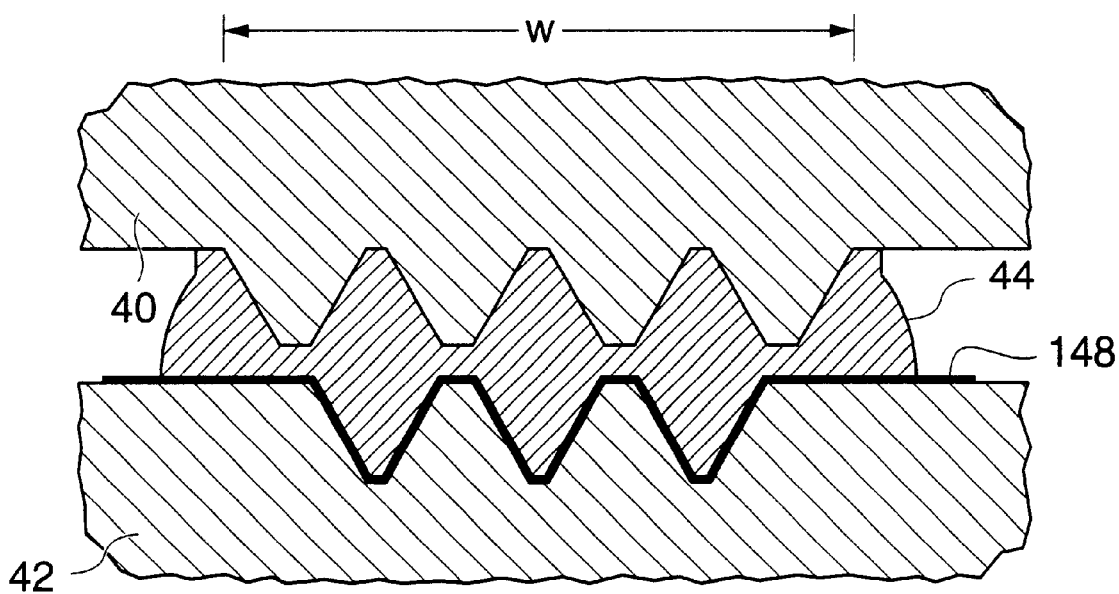
FIG. 21 shows a metallized feedthrough of the bond of the type shown in FIG. 8.

One way to electrically connect inside (located inside the bonded area) electrical components on the die to external contact pads on the die is to deposit a metal layer and lithographically define metal traces in such a way that these metal traces cross the trenches or ridges. This is shown in FIGS. 20 and 21 which are similar respectively to FIGS. 4 and 8 with the addition of metal traces 146, 148. This method is not applicable to all types of wafer profiles. For example, it is difficult to form such metallization in trenches having a negative slope of the trench side walls. One disadvantage of using such underlying metal stripe connections is that adhesion of some bonding materials to metal traces 146, 148 is usually poorer than to oxide. In this case there is a danger of leakage of moisture through the metal bonding material interface. The probability of this type of leakage decreases if the total length of this interface is made larger. On the other hand, the width of the bonding ring is limited and should be minimized to conserve area of the die. Therefore, these requirements are contradictive.

Figure 22:
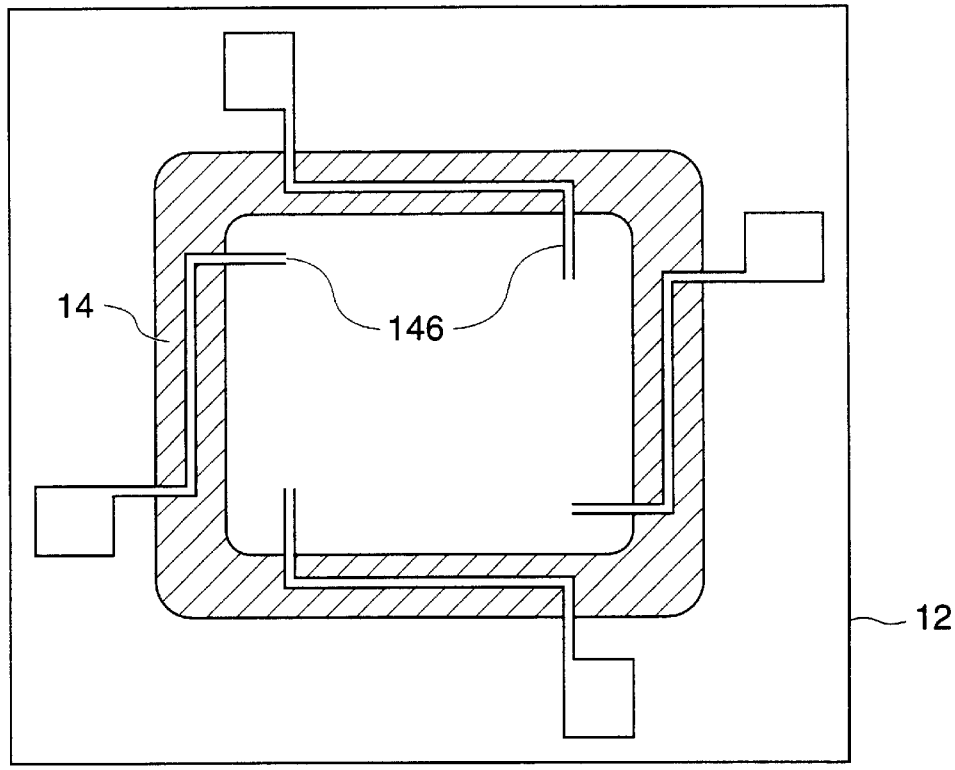
FIGS. 22 and 23 show in plan view elongated feedthroughs extending under the bonding area for better sealing.
Figure 23:
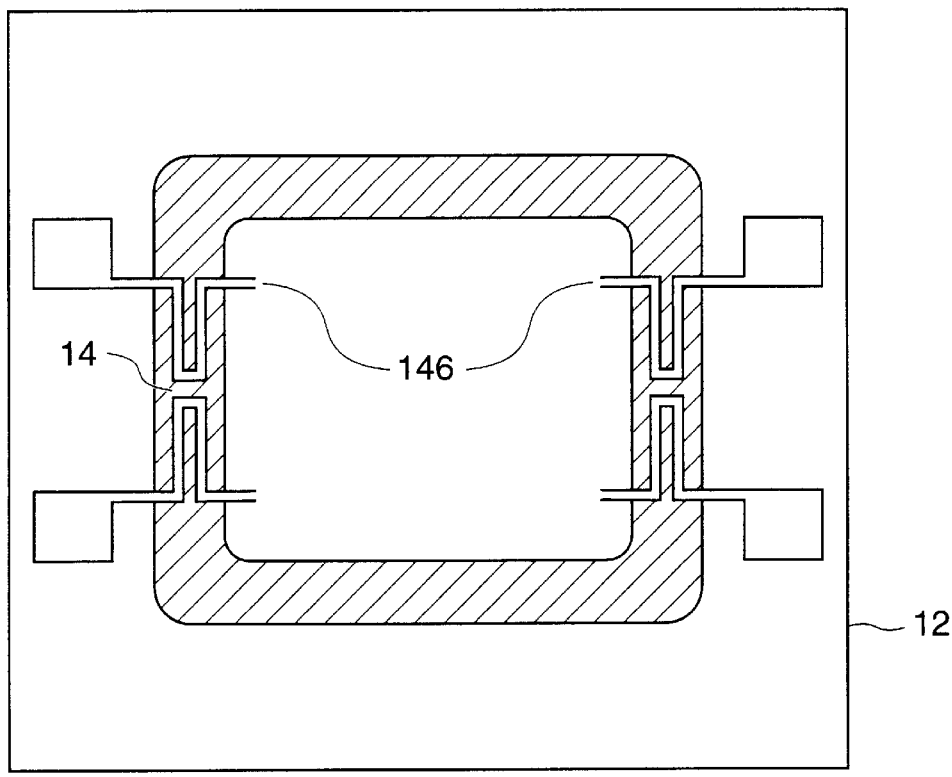

It is possible to solve this problem by increasing the length of the metal traces by positioning them inside the bonding ring 14 and extending along the length of the bonding ring 14, as shown in plan view in FIGS. 22 and 23, both showing variations of the FIG. 20 structure.

Diffusion Feedunders

Figure 24:
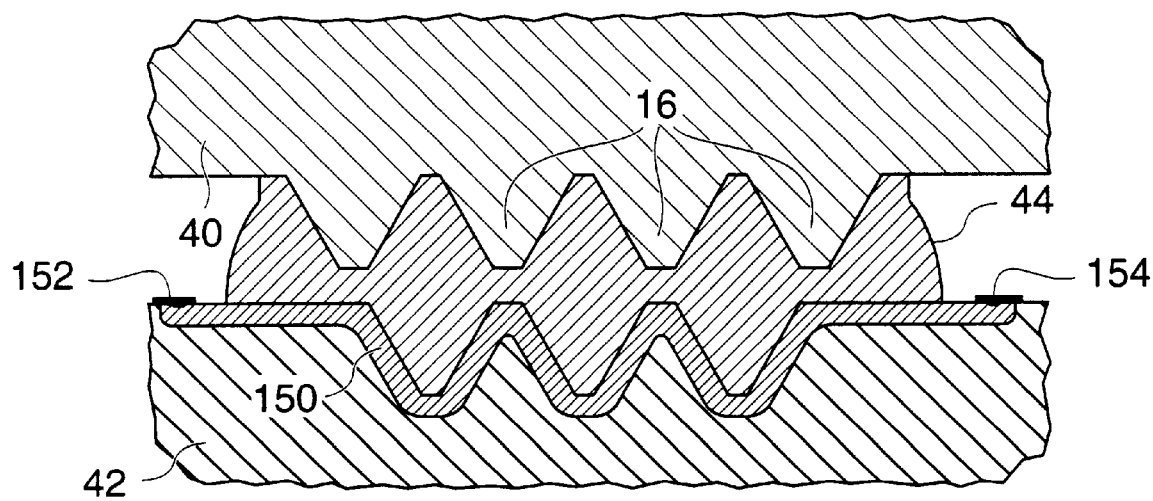
FIGS. 24 and 25 show use of diffused doped regions for electrical feedthroughs in wafer-to-wafer bonding.
Figure 25:
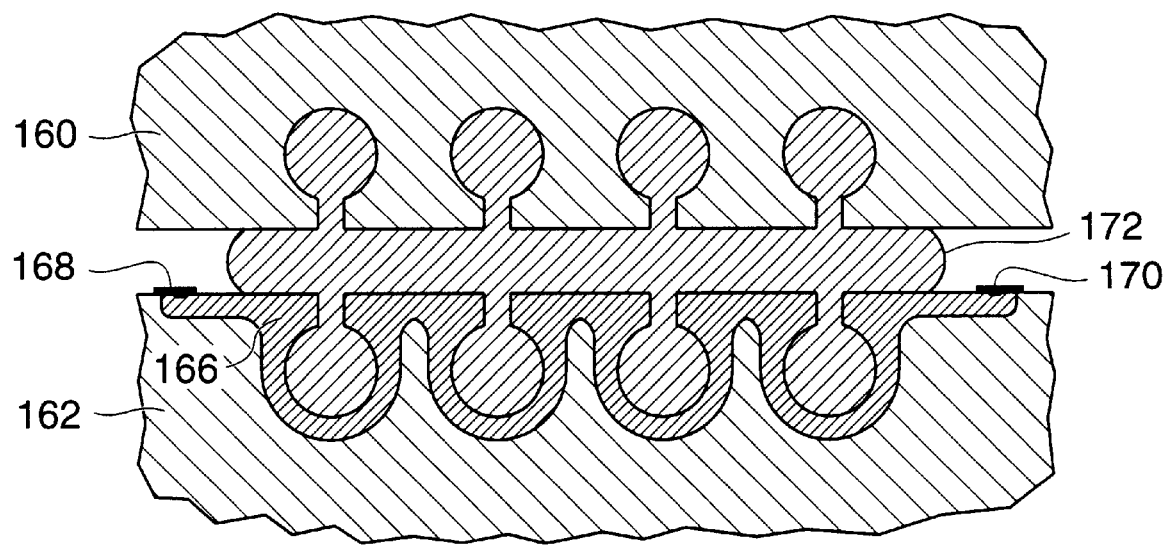

Another way to achieve electrical feed-through, which is also used for flat bonded surfaces, is to fabricate local diffusion (doped silicon) areas extending perpendicular to the trenches or ridges so that the local diffusion areas start inside bonded area, then cross the trenches and stop outside the area. These diffusion areas are heavily doped so as to be electrically conductive and hence function as electrical feed-throughs. Electrical contacts with metallization on the local diffusion areas are made both inside and outside of the bonding area, as shown in two variations in FIGS. 24 and 25. FIG. 24 shows in cross section a structure similar to that of FIG. 8 with the addition of diffusion area 150 formed on the profiled surface of wafer 42, with metallized areas 152, 154 formed on either end thereof. FIG. 25 illustrates a similar structure with wafers 160, 162 where wafer 162 has a diffusion area 166 with overlying metallized areas 168, 170 and the bonding material 172 intervenes between the wafers 160, 162. This local diffusion can be applied to almost any profile of the trenches and can be used when metal traces (as in FIG. 21) feeding through the bonding material area do not provide good adhesion to the bonding material.

Implantation or Diffusion Paths

Figure 26:
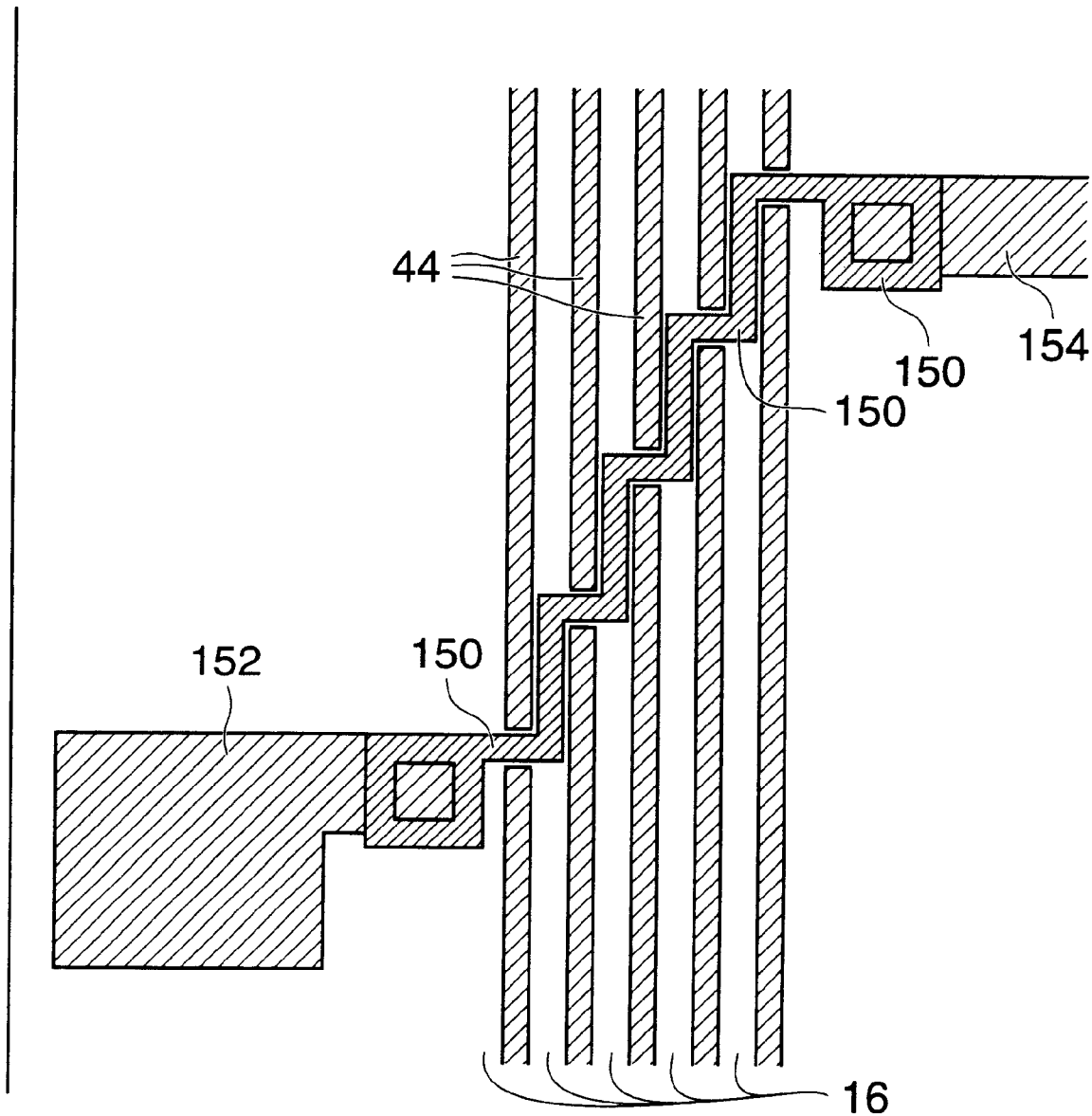
FIG. 26 shows a plan view of a feedthrough through a wafer-to-wafer bond.

The layout of the trenches or ridges 16 in the FIG. 24 structure can be made so there is a continuous planar path on the top of the ridges 16 from inside to outside of the bonded area, as shown in plan view in FIG. 26. In this case feedunder 150 on the planar surface can be fabricated by either ion implantation or diffusion. This structure does not have limits on the shape of the profile. It can be made also with the bridge structures similar to those shown in FIGS. 14 and 15.

Spacers

Figure 27:
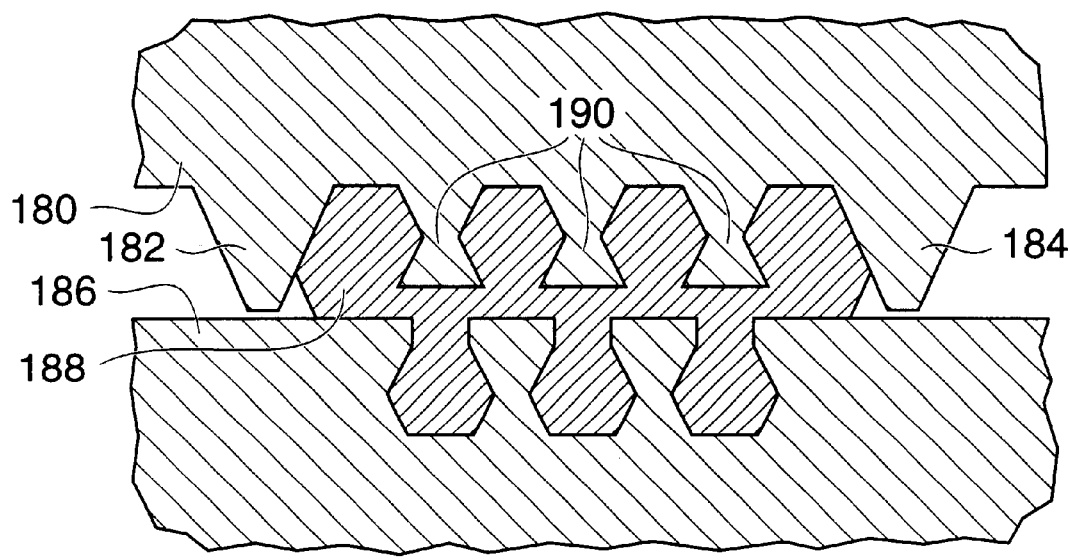
FIGS. 27 and 28 show use of spacers in wafer-to-wafer bonding.
Figure 28:
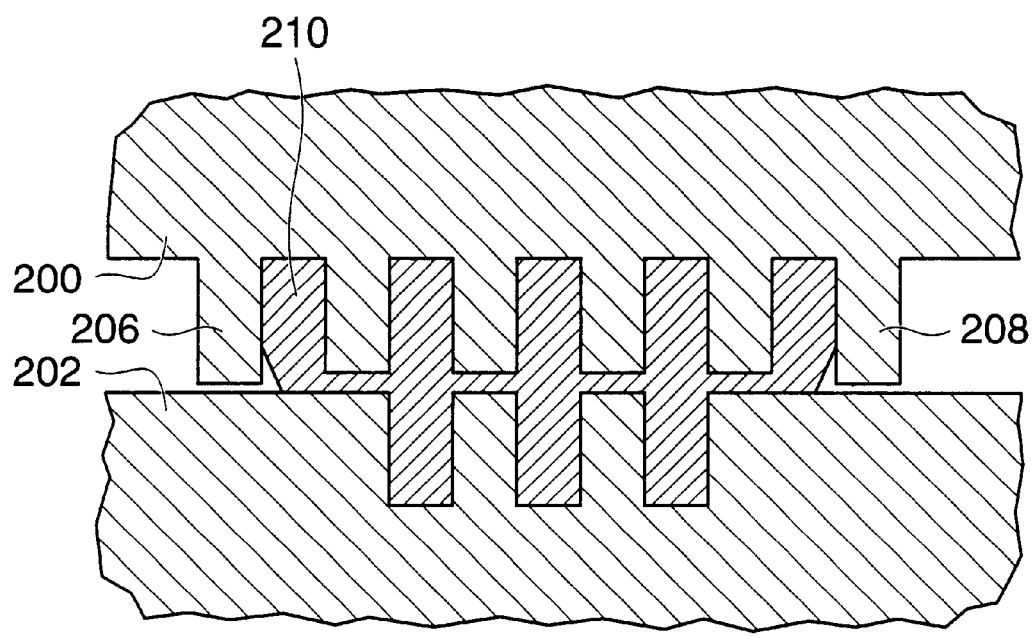

In some cases it is important to control the thickness of the bonding material layer between the wafers; this is more important when the viscosity of the bonding material is high and high external pressure (to squeeze the bonding material to the desired thickness) is required, as used e.g. in polymer bonding. In this case, spacers extending from the surface of one of the wafers are formed, for example, as shown in FIGS. 27 and 28. In FIG. 27, wafer 180 defines spacers 182, 184 that bear on the opposing surface of wafer 186 and thereby force bonding material 188 to have a particular thickness. The thickness of the bonding material 186 is determined by the difference between the height of the spacers 182, 184 and the height of the ridges 190. A similar structure with wafers 200, 202 and spacers 206, 208 with intervening bonding material 210 is shown in FIG. 28 in cross section.

Barriers

Such spacers can serve several additional functions: as a limiting barrier for bonding material spreading out the bonding area in the process of bonding; limiting the spread of bonding material in the process of its depositing, for example, by screen printing; and preventing particle contamination of the bonding area, for example, by saw slurry which can electrically short different metal areas in the case of metal bonding. These barriers when extended to the edges of the die can close the gap between the wafers, providing a continuous side wall surface for external hermetic sealing, for example, for final hermetization with PECVD oxide or nitride.

Figure 29:
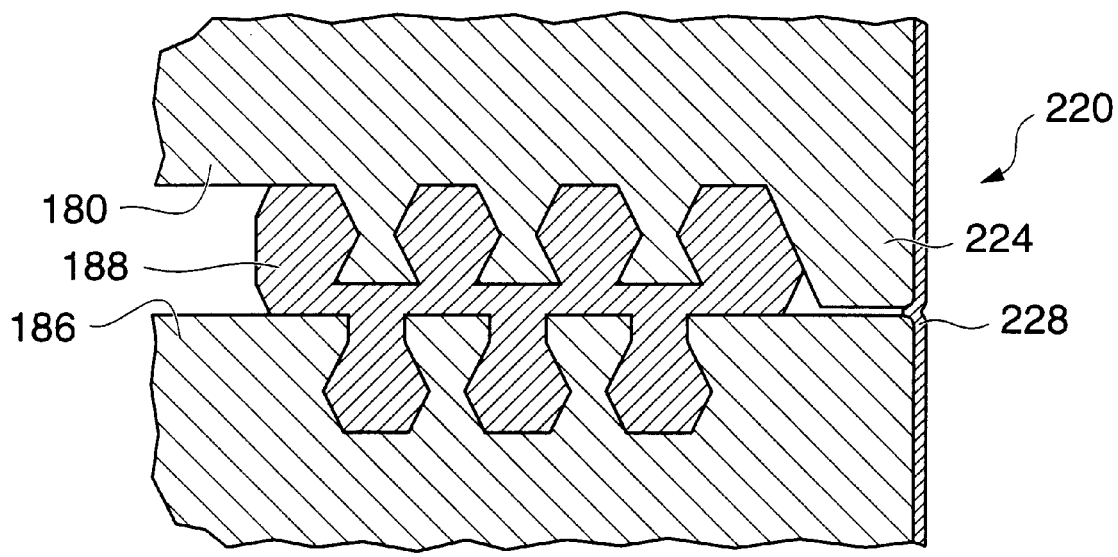
FIGS. 29 and 30 show sealing of chip edges with use of spacers.
Figure 30:
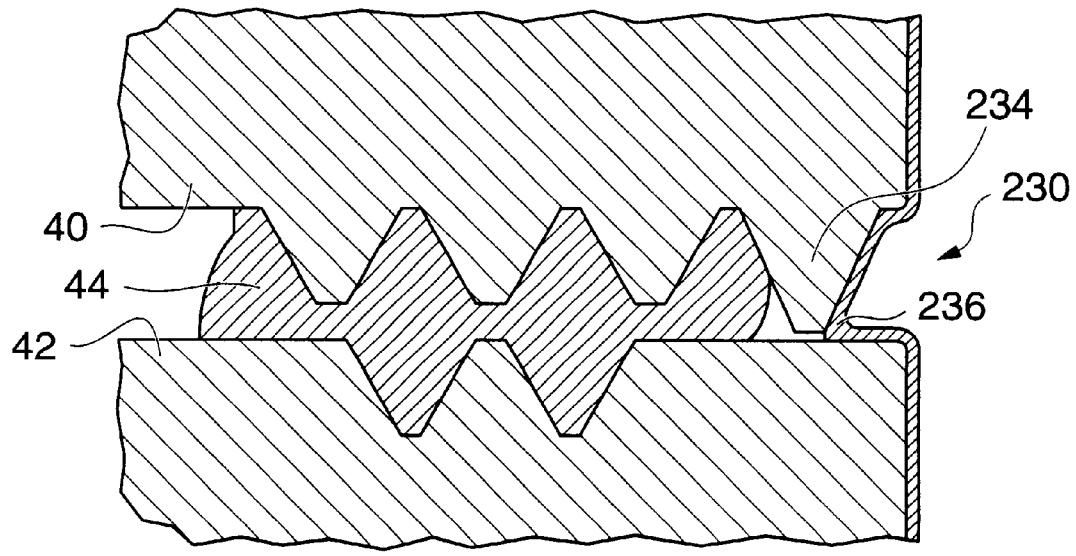

In this case the problem of mechanical strength of the bond and hermetization can be solved separately. First, a mechanical wafer-to-wafer bond is made, for example by a polymer bonding material. The strength of this mechanical bond is sufficient to allow safe exposure of the die edges, for example, by sawing. Then after exposing all the edges of the die to be hermetized, PECVD oxide (or some other hermetic material) is deposited at the die edges, providing true hermeticity, as shown in FIGS. 29 and 30 in cross section. In FIG. 29, similar to FIG. 27 but showing a die edge 220, spacer 224 is formed on wafer 180 and bears against the surface at wafer 186. Sealing material 228 seals the die edge 220. In FIG. 30, similar to FIG. 8 but showing a die edge 230, spacer 234 is formed on wafer 40 and bears against the surface of wafer 142, and sealing material 236 seals die edge 230.

Figure 31:
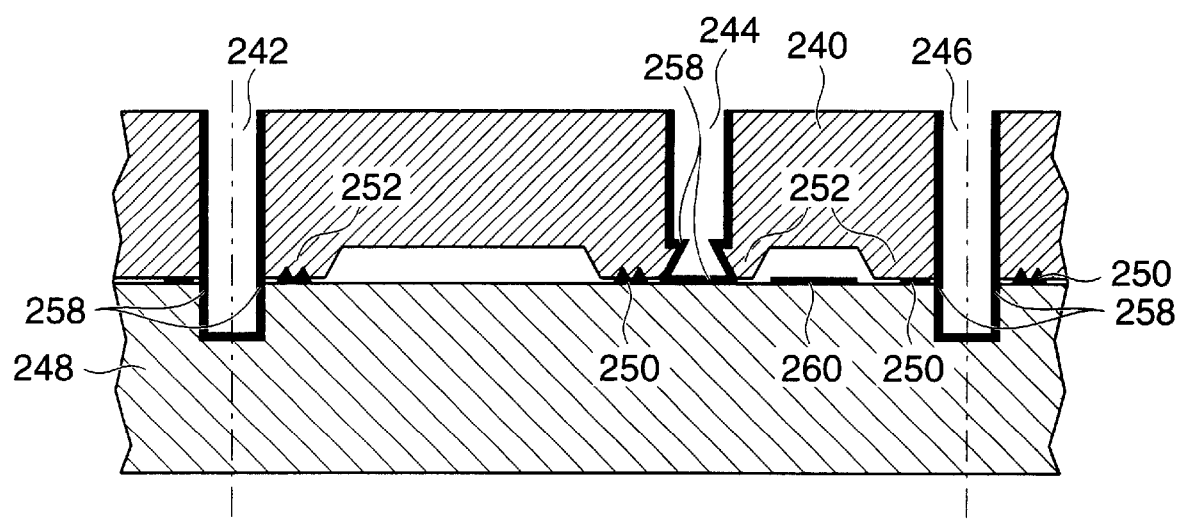
FIG. 31 shows a system of contact holes and penetrations for achieving hermetic sealing.

At the same time, these barriers can be used for protection of the contact pads from final hermetic layer deposition. This saves a lithography step, as shown in cross section in FIG. 31 where upper wafer 240 defines die edge openings 242, 244, 246 extending down to the second wafer 248 bonded to upper wafer 240 by bonding material 250 applied on profiled ridges (as described above) with spacers 252 on wafer 240. Sealing material 258 is applied to the interiors of holes 242, 246, and contact opening 244. Metallization 260 lies on the surface of die 248. The dotted lines are an indication of die boundaries where sawing occurs to scribe the individual dice.

Capillary

Figure 32:
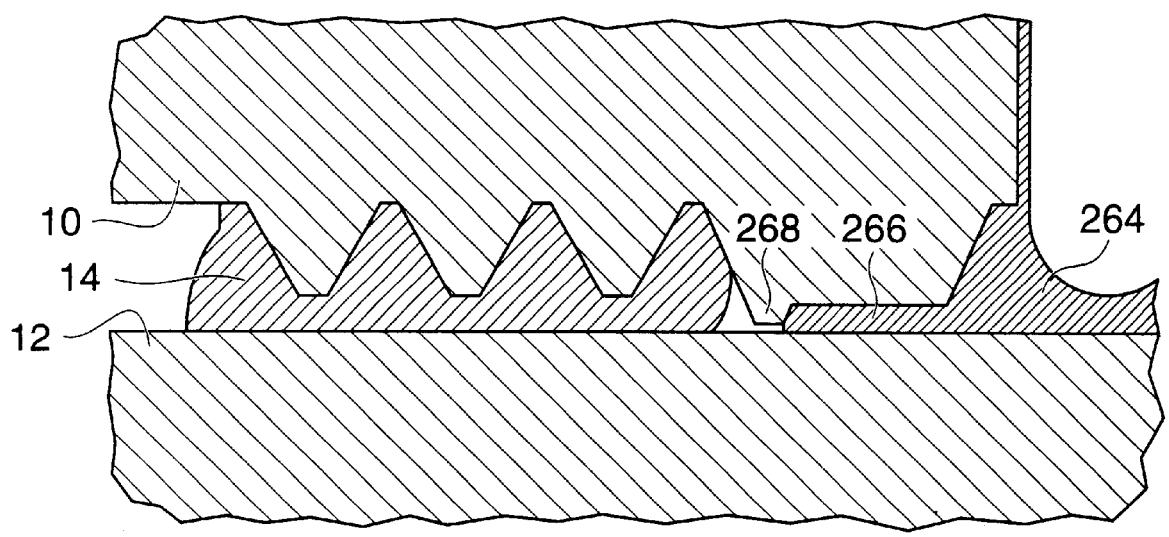
FIGS. 32 and 33 show hermetic sealing using capillaries.
Figure 33:
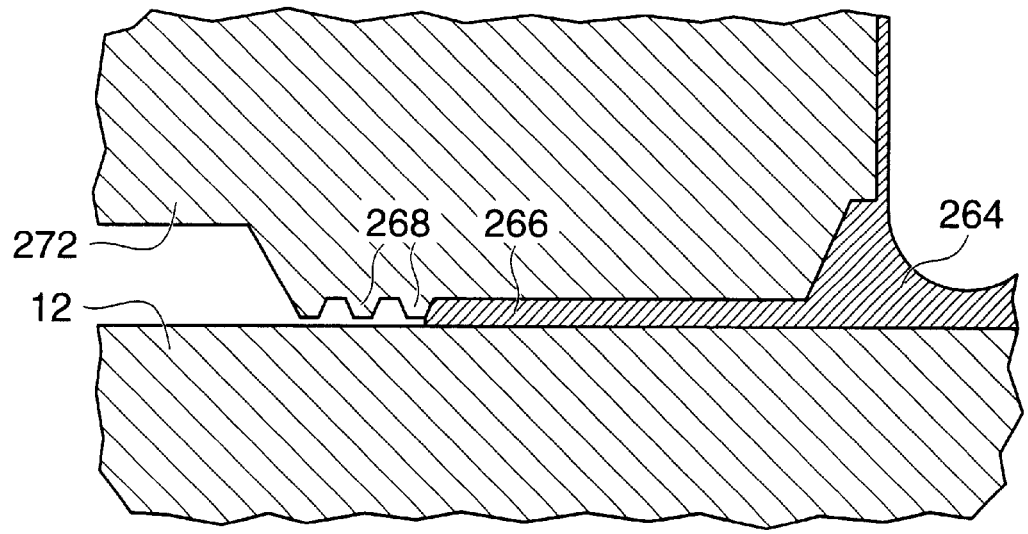

Another way to make edge hermetization is to define a continuous capillary space at the die edges between the bonded wafers around the bonding area. Similar to PECVD external hermetization, mechanical (non-hermetic) wafer to wafer bonding is made first. The strength of this mechanical bonding is sufficient to allow safe exposure of the die edges, for example by sawing. Then after exposing all the edges of the individual dice to be hermetized, a liquid hermetic sealing material, for example spin-on-glass, is applied to the wafers. This liquid hermetic penetrates into the capillary space between the wafers around the bonding area, as shown in cross-section in FIGS. 32 and 33. In FIG. 32 (similar to FIG. 4) wafers 10, 12 are bonded by bonding material 14. Additionally, at the edge of each die surrounding the bonding area a trench is defined and hermetic sealing material 264 applied therein, as in FIGS. 29 and 30. The sealing material 264 penetrates by capillary action into narrow opening 266, defined by spacer 268. A similar structure is shown in FIG. 33, where upper wafer 272 has a slightly different profile and no bonding material is shown. Wafers 12 and 272 can be held together by a mechanical fixture during capillary filling in and curing of the sealing material. The ridges 268 prevent the sealing material from getting inside the cavity. After curing this hermetic sealing material 260 in the capillary opening 266, a true hermetization with the required bonding force is achieved. Liquid hermetization bonding, in comparison with PECVD hermetization, has these advantages: there is no need to expose all the edges of the die (sawing around the die) to provide uniform hermetization; the mechanical (non-hermetic) bonding need not be as strong or can be eliminated; and mechanical protection of the contact pads during the bonding, if necessary, can be achieved more easily as in FIG. 31.

Figure 34:
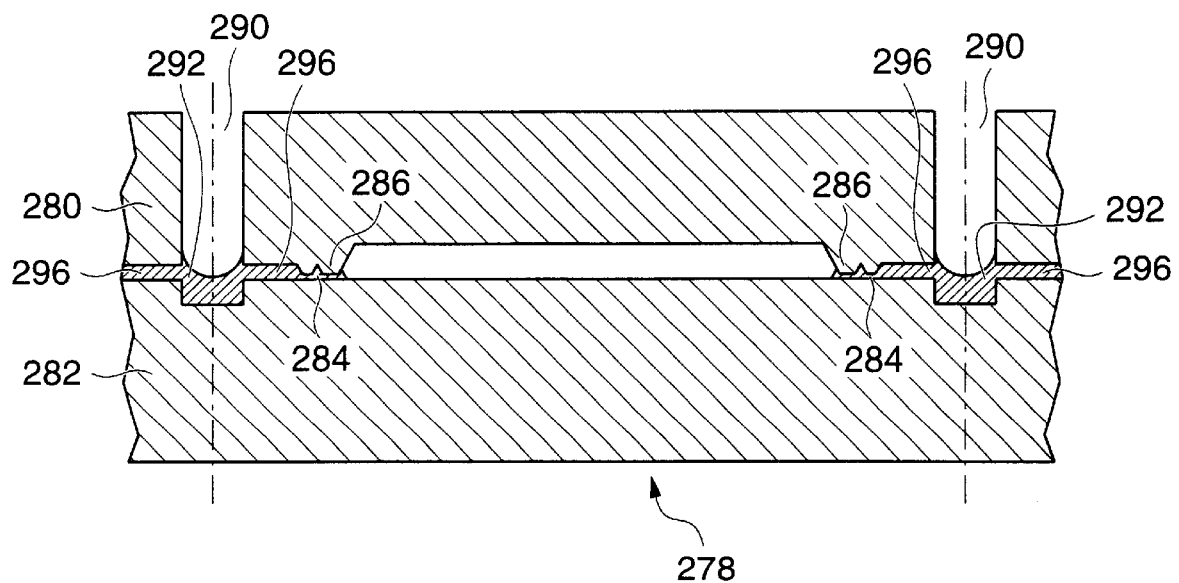
FIGS. 34 and 35 show hermetic sealing again using capillaries and filling holes through the top wafer.
Figure 35:
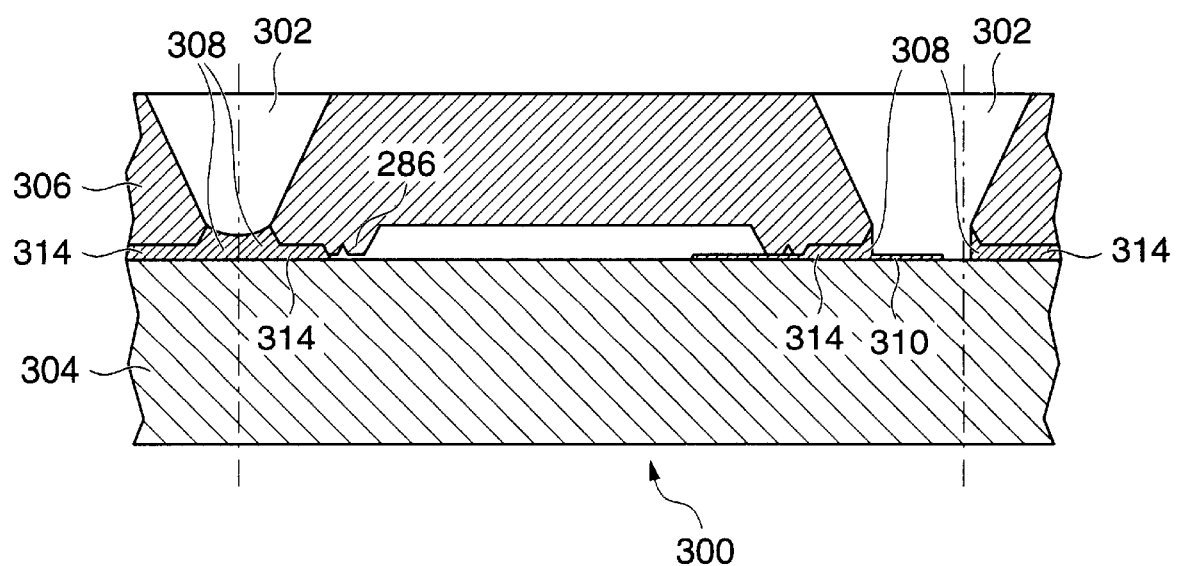

An illustration of hermetic sealing for an entire wafer assembly 278 is shown in cross-section in FIG. 34. Upper wafer 280 is bonded to lower wafer 282 by bonding material 284 applied at profiled ridges 286. Funnels 290 extend through upper wafer 280 into lower wafer 282, to allow the liquid hermetic sealing material 292 to extend into capillary regions 296. FIG. 35 shows a similar wafer assembly 300, with different shaped funnels 302 which do not penetrate into the lower wafer 304 but do penetrate through upper wafer 306, with hermetic sealing material 308 covering metal area feedthroughs 310 (as described above) at capillary regions 314. At the first stage the wafers are either mechanically bonded (FIG. 34) or clamped (not shown) with a temporary mechanical fixture (FIG. 35). Then the liquid hermetic is applied to the top surface of the upper wafer. This hermetic flows through the funnels and fill in the capillaries around the bonding areas of the die. Then the liquid hermetic is cured and the wafer is ready for dicing (sawing), along the planes indicated by the broken lines. If metal contact pads 310 are covered by the cured hermetic, this sealing material on the top of the contact pads can be etched off through the same funnels (for example, using plasma etching) without affecting the bonding area.

Profile Microstructures and their Fabrication Processes

The following describes various microstructures and etching processes for forming the above-described wafer bridges, pits, pyramids, etc., profiles; these processes are for monocrystalline silicon wafers and are not limiting.

1. V-type trench: (100) and <110>, 54°44' with Anisotropic Etching (AE)

Figure 36:
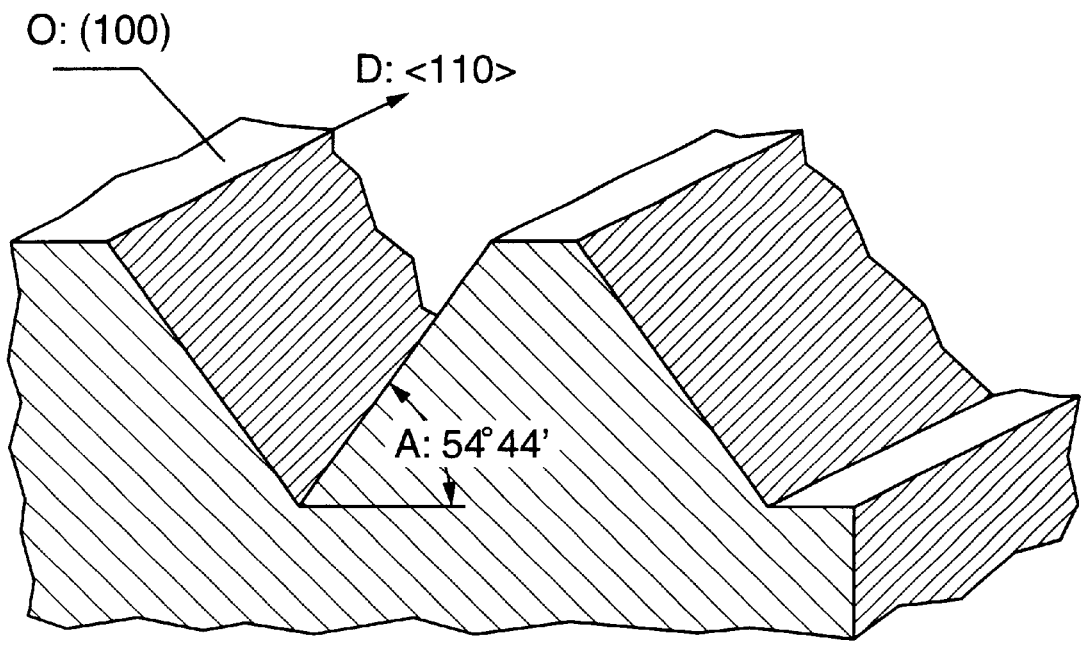
FIGS. 36 to 55 show in perspective views etching to achieve the various structures shown in the previous drawings.

This profile, part of which is shown in perspective view in FIG. 36, can be made on silicon wafers with crystalline orientation O (100) when the longitudinal direction D of the ridges is <110>. The angle of the side walls is 54°44". This profile can be fabricated using any of the known etchants for anisotropic etching such KOH, NaOH, LiOH, EDP, Hydrazine, Gallic acid, TMAH, etc.

2. V-type trench: (100) and <100>, 45° with Anisotropic Etching

Figure 37:
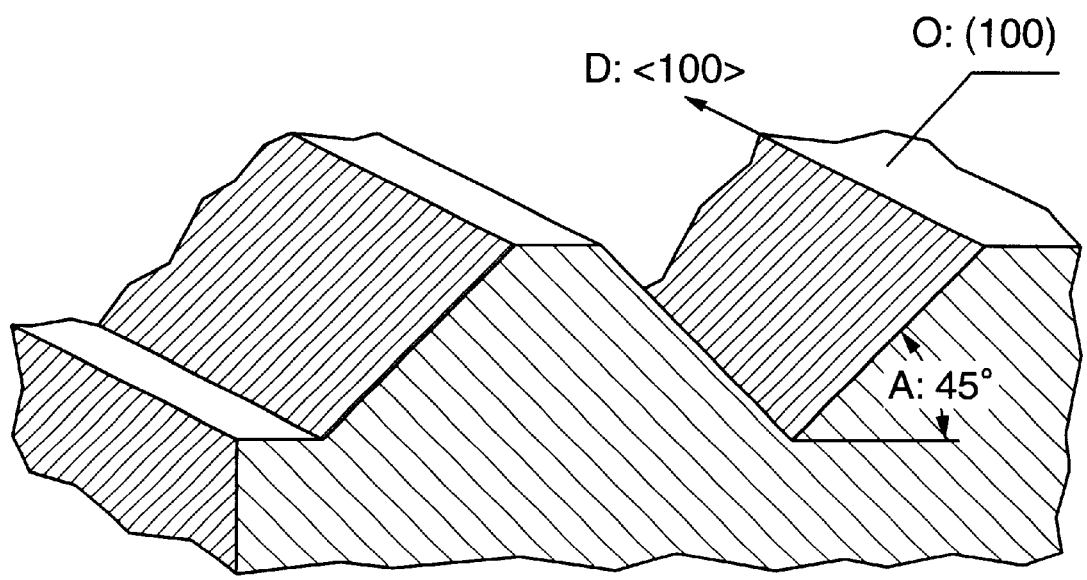

This profile shown in perspective view in FIG. 37 can be made on silicon wafers with orientation O (100) when the longitudinal direction D of the ridges is <100>. The angle of the side walls can be 45°. This profile can be fabricated using any of the etchants for anisotropic etching such as KOH+IPA, TMAH+IPA, etc.

3. V-type trench: (110) and <110>, 36°16' with Anisotropic Etching

Figure 38:
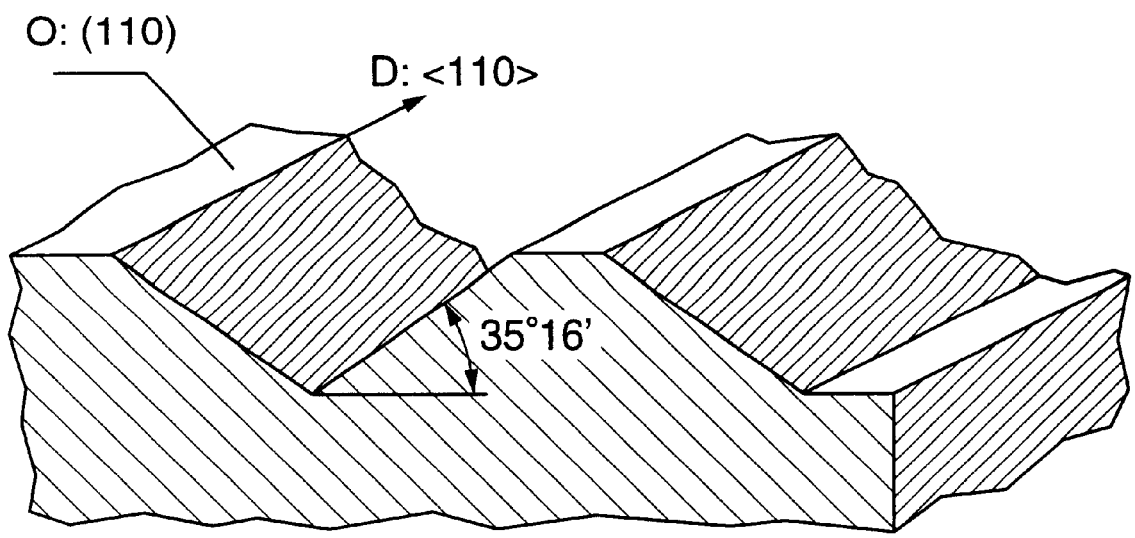

This profile shown in perspective view in FIG. 38 can be made on silicon wafers with orientation O (110) when the longitudinal direction D of the ridges is <110>. The angle of the side walls is 35°16". This profile can be fabricated using any of the etchants for anisotropic etching such as KOH, NaOH, LiOH, EDP, Hydrazine, Gallic acid, TMAH, etc.

4. V-type trench: (110) and <100>, 45° with Anisotropic Etching

Figure 39:
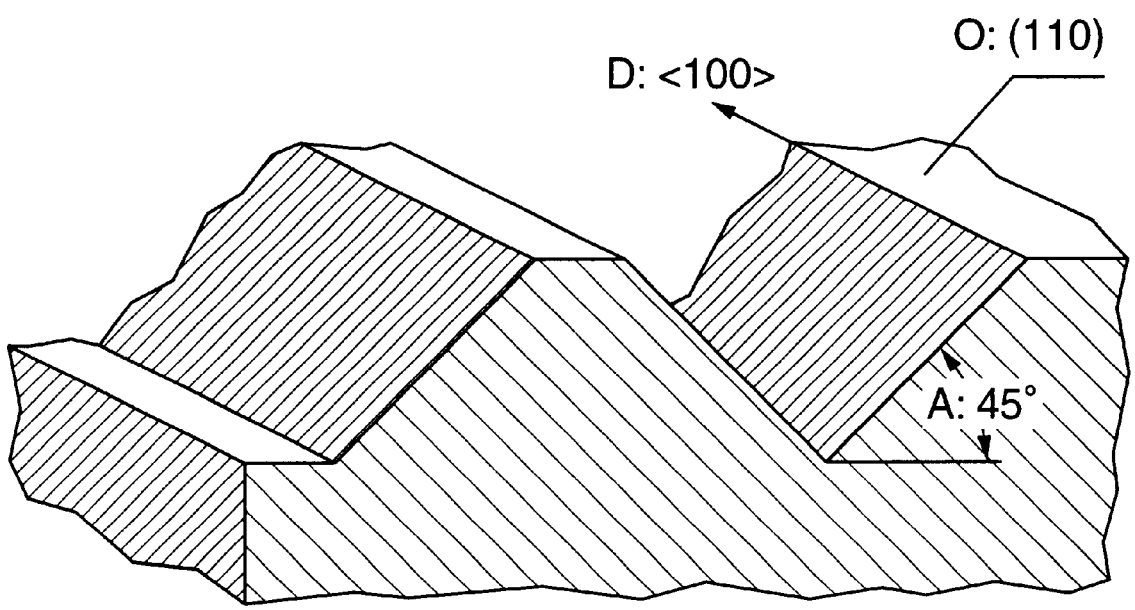

This profile shown in perspective view in FIG. 39 can be made on silicon wafers with orientation O (110) when the longitudinal direction D of the ridges is <100>. The angle of the side walls can be 45°. This profile can be fabricated using any of the etchants for anisotropic etching such as KOH, NaOH, LiOH, EDP, Hydrazine, Gallic acid, TMAH, etc.

5. U-type trench: (100) and <100>, 90° with Anisotropic Etching

Figures 40, 41:
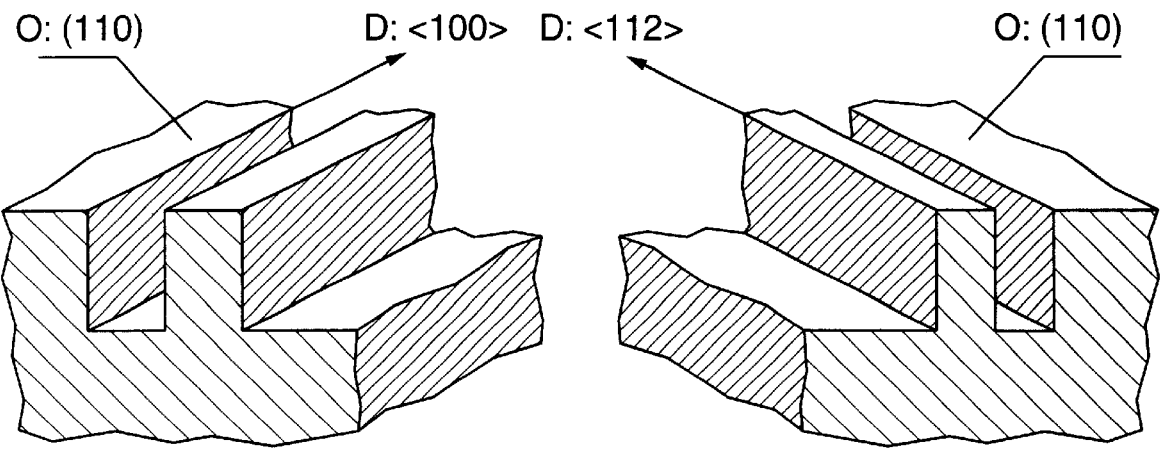

This profile shown in perspective view in FIG. 40 can be made on silicon wafers with orientation O (100) when the longitudinal direction D of the ridges is <100>. The angle of the side walls can be 90°. This profile can be fabricated using etchants such as KOH, NaOH, LiOH, EDP, Hydrazine, Gallic acid, TMAH, etc.

6. U-type trench: (110) and <112>, 90° with Anistropic Etching

This profile shown in perspective view in FIG. 41 can be made on silicon wafers with orientation O (110) when the longitudinal direction D of the ridges is <112>. The angle of the side walls is 90°. This profile can be fabricated using any of the etchants for anisotropic etching such as KOH, NaOH, LiOH, EDP, Hydrazine, Gallic acid, TMAH, etc.

7. U-type trench: any O&D ( Orientation and Direction) with RIE

Figures 42, 43:
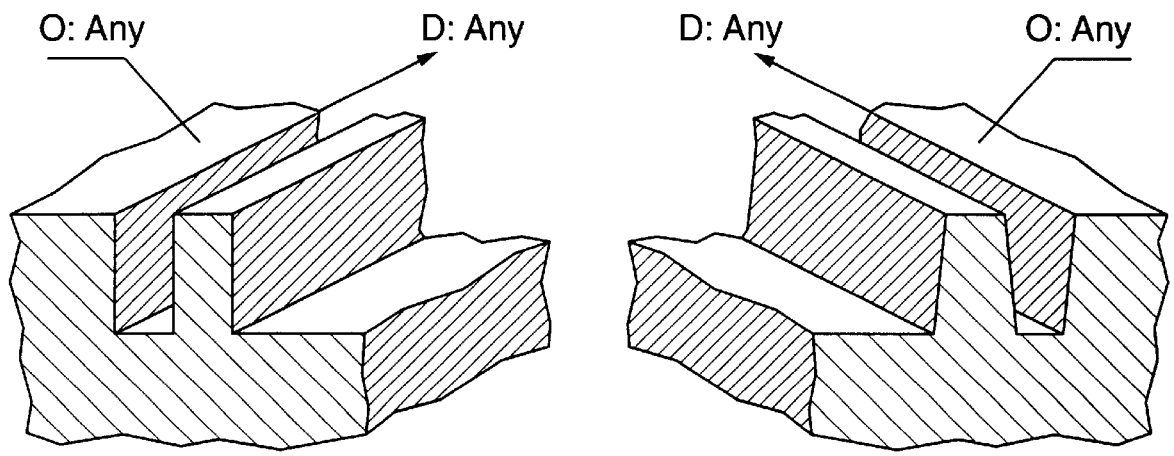

This profile shown in perspective view in FIG. 42 can be made on silicon wafers of any orientation O of the surface and longitudinal direction D of the ridges. The angle of the side walls is 90°. This profile can be fabricated with anisotropic RIE (reactive ion etch) etching.

8. U-type trench: any O&D with IPE (Isotropic Plasma Etching)

This profile shown in perspective view in FIG. 43 can be made on silicon wafers of any orientation O of the surface and longitudinal direction D of the ridges. The angle of the side walls is 90°. This profile can be fabricated with isotropic plasma etching (IPE).

9. C-type trench: any O&D with Isotropic Etching

Figure 44:
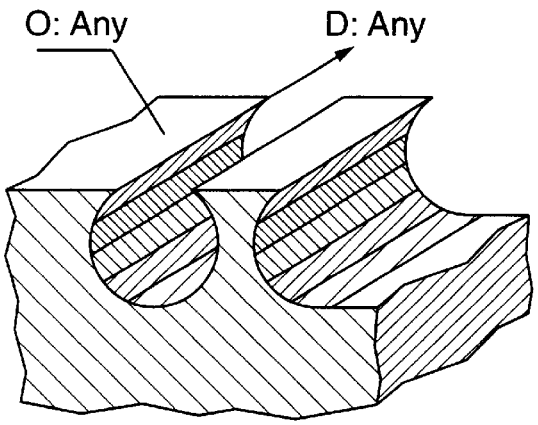

This profile shown in perspective view in FIG. 44 can be made on silicon wafers of any orientation O of the surface and longitudinal direction D of the ridges. The side walls are curved. This profile can be fabricated with various kinds of isotropic etching (IE) such as wet, plasma, gas, etc.

10. Diamond-type trench: (100) and <110>-with RIE and AE

Figure 45:
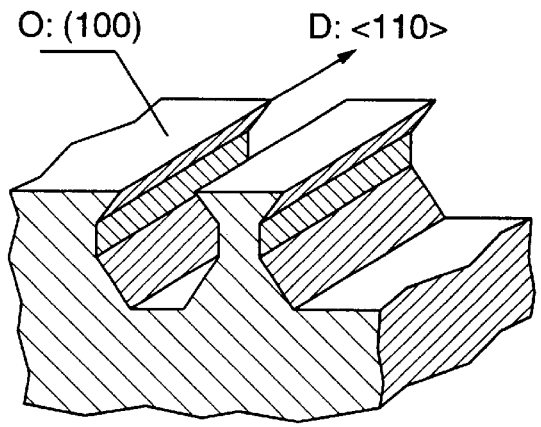
Figure 46:
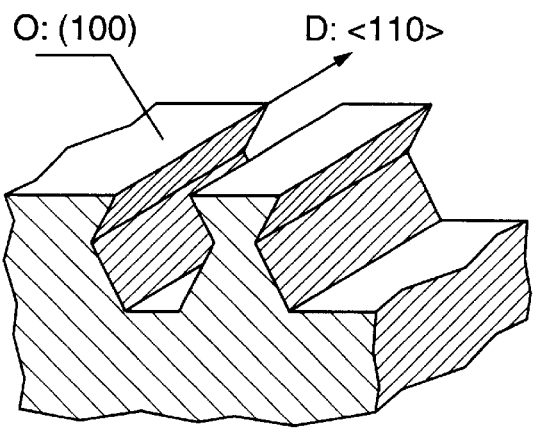
Figure 47:
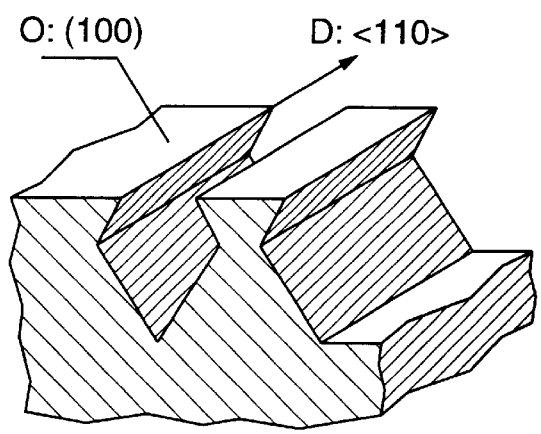

The profiles shown in perspective view in FIGS. 45, 46, 47 can be made on silicon wafers with orientation O (100) when the longitudinal direction D of the ridges is <110>. The side walls are formed with facets created by different combination of crystallographic planes (111) and (110). This profile can be fabricated by a combination of RIE etching at the first stage and anisotropic etching at the second stage. If the anisotropic etching stage is short, then one can obtain the shape of the side walls shown in FIG. 45. If the anisotropic etching takes place longer, then the shape shown in FIG. 46 is obtained. And finally, the profile shown in FIG. 47 can be fabricated when the (110) planes on the side walls and (100) planes on the bottom of the trenches are etched off; then the side walls are shaped only by the (111) planes.

11. Keyhole-type: any O&D with RIE and SWM (side wall masking) and IE (isotropic etching)

Figure 48:
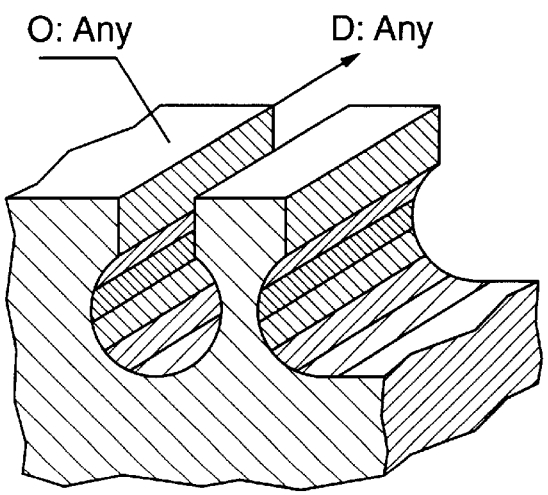

This profile shown in perspective view in FIG. 48 can be made on silicon wafers of any orientation O of the surface and longitudinal direction D of the ridges. This profile is fabricated by a combination of RIE etching at the first stage, side wall masking (SWM) at the second stage and isotropic etching at the third stage. Between the second and third stages there may be an additional RIE etching step if necessary.

12. Key hole with diamond shaped-type trench with RIE and SWM and AE

Figure 49:
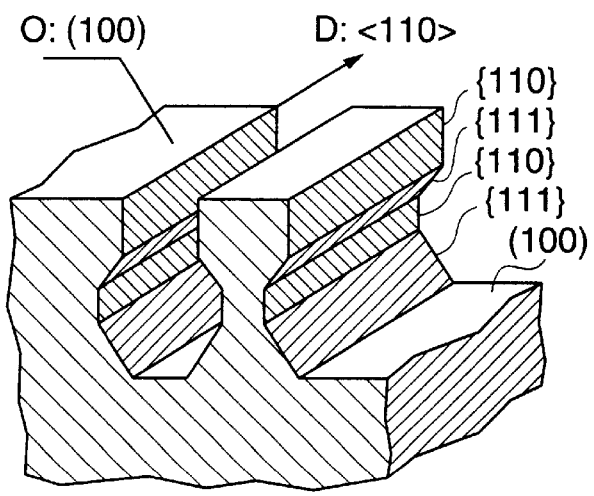
Figure 50:
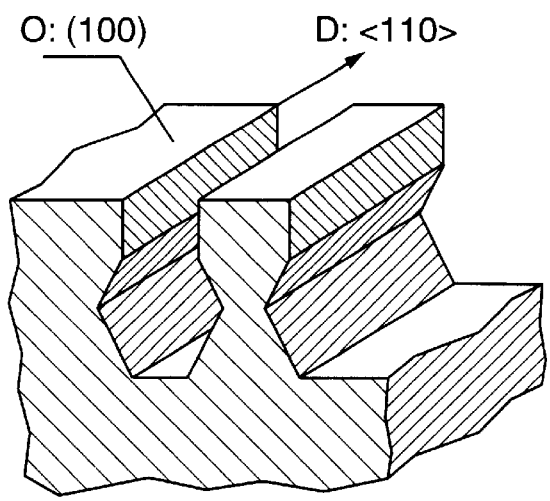
Figure 51:
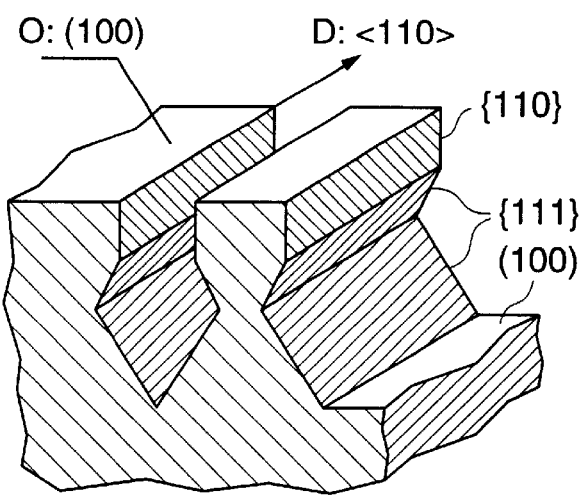

This profile shown in perspective view in FIG. 49 can be made on silicon wafers with orientation O (100) when the longitudinal direction D of the ridges is <110>. The side walls are formed by the vertical walls (110) from the surface and then by facets from crystallographic planes (111) and (110). This profile is fabricated by a combination of RIE etching at the first stage, side wall masking (SWM) at the second stage, additional RIE etching at the third stage and, finally anisotropic etching at the fourth stage. If the anisotropic etching stage is short, then the shape of the side walls is as shown in FIG. 49. If anisotropic etching is longer, then the sidewall shape shown in FIG. 50 is obtained. And finally, the profile shown in FIG. 51 is obtained when the (110) planes on the side walls and (100) planes on the bottom of the trenches are etched off. Then the side walls at the bottom of the key hole are shaped only by the (111) planes.

13. Bridge with isotropic undercut-type trench

Figure 52:
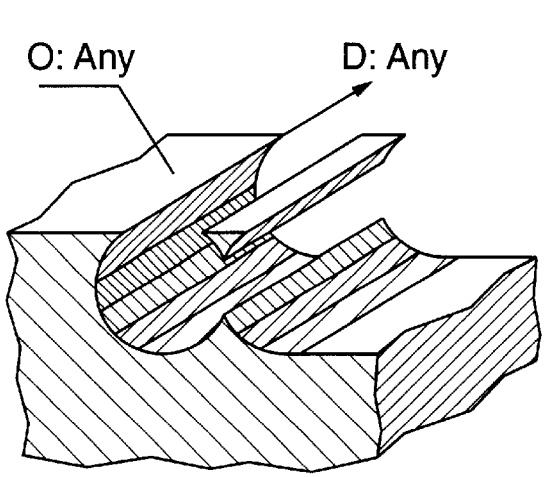

This profile shown in perspective view in FIG. 52 can be made on silicon wafers of any orientation of the surface and longitudinal direction of the bridges. This profile can be fabricated either by pure isotropic etching in one stage or by combination of RIE etching at the first stage and isotropic etching at the second stage.

14. Bridge with isotropic undercut-type trench with RIE and SWM and IE

Figure 53:
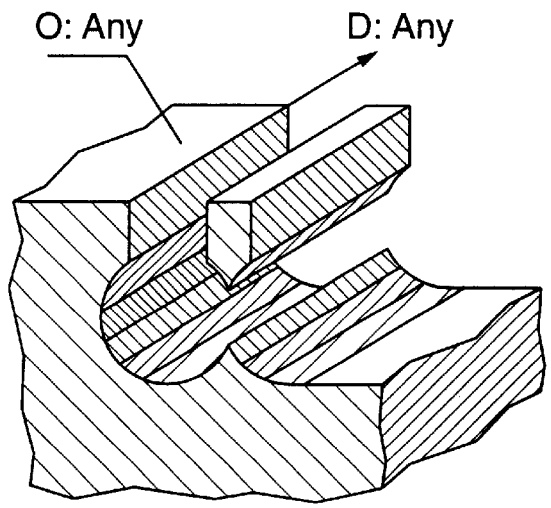

This profile shown in perspective view in FIG. 53 can be made on silicon wafers of any orientation O of the surface and longitudinal direction D of the bridges. This profile is fabricated by a combination of RIE etching at the first stage, side wall masking (SWM) at the second stage and isotropic etching at the third stage. Between the second and third stages there may be an additional RIE etching stage if necessary.

15. Bridge with anisotropic undercut type trench with RIE and SWM and AE

Figure 54:
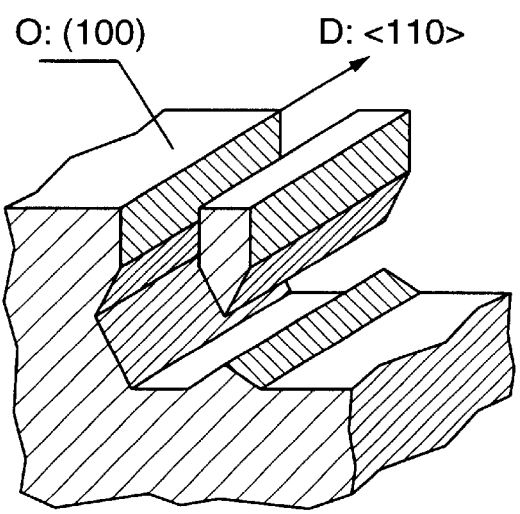
Figure 55:
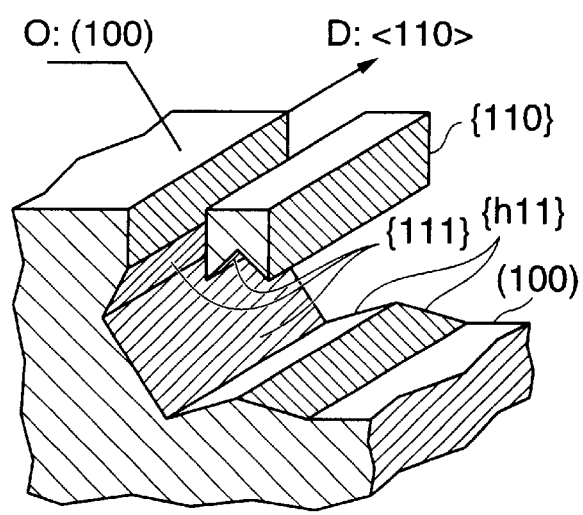

This profile shown in perspective view in FIG. 54 can be made on silicon wafers with orientation O (100) when the longitudinal direction D of the bridges is <110>. The side walls are formed by the vertical walls (110) from the surface and then by facets from crystallographic planes (111) and (110). This profile is fabricated by a combination of RIE etching at the first stage, side wall masking (SWM) at the second stage, additional RIE etching at the third stage, and finally anisotropic etching at the fourth stage. If the anisotropic etching stage is short, the shape of the side walls is as shown in FIG. 54. If anisotropic etching is longer, then the shape shown in FIG. 55 is obtained. The side walls of the bridge itself are shaped by the (110) planes and the bottom side of the bridge is shaped only by the (111) planes.

In all the above examples, the ridges and trenches in a plan view can be laid out in rectangles, rounded corners, or circles, paralleled stripes, or in a grid of cells, e.g. brick type, honey comb, circles, linear or V-type cells.

Anisotropic Undercut Process

FIGS. 56–66 show various steps used to fabricate some of the above described structures with an anisotropic undercut process; these steps are illustrative and not limiting. Further, while the structure that results herein is novel, the individual fabrication steps each use standard etching processes of types well known in the art and described above with reference to e.g. FIGS. 36–55. Therefore the various times of etching, etc. are not provided in any particular detail since they are well understood by one of ordinary skill in the art.

Figure 56:
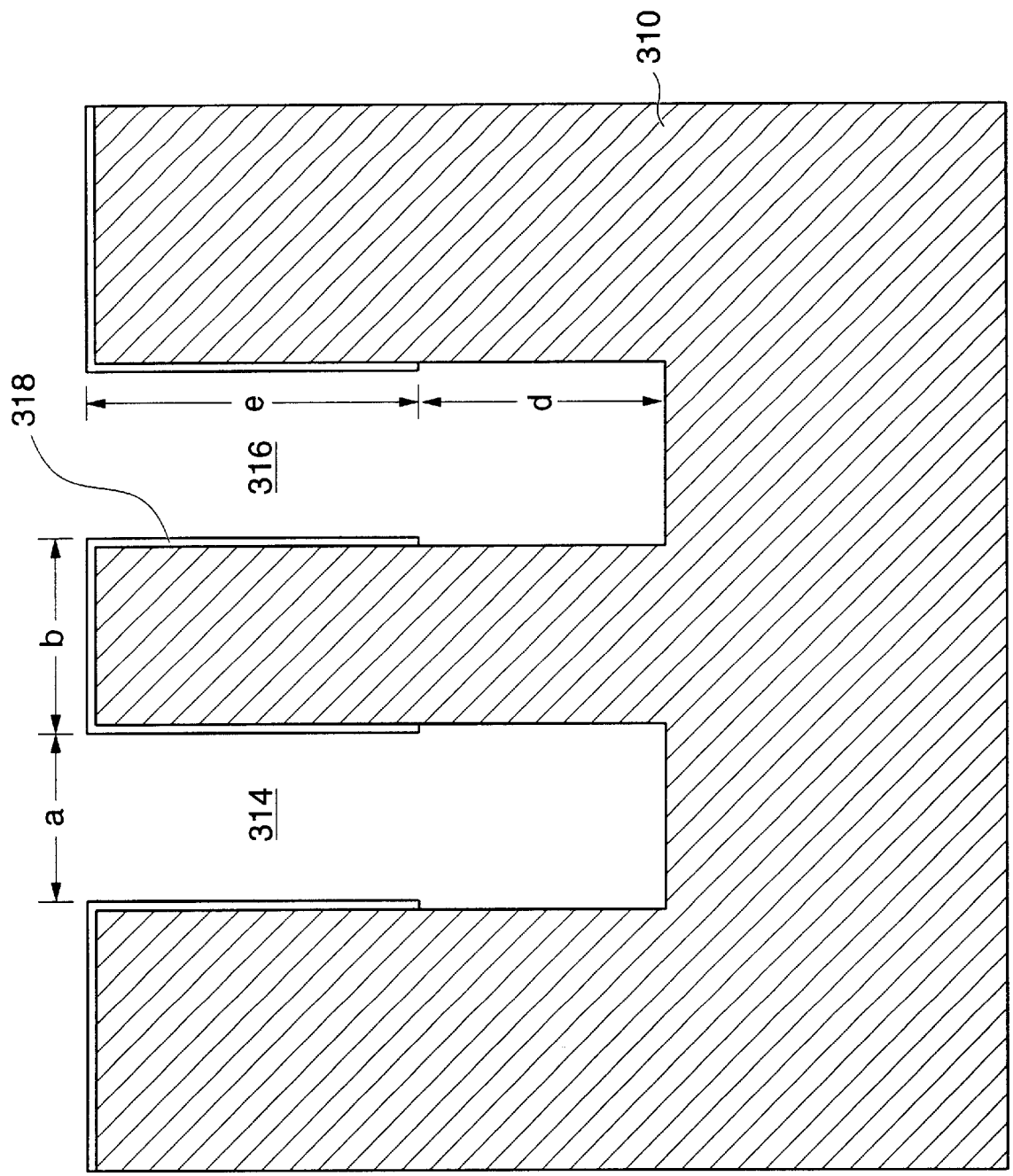
FIGS. 56–66 show process steps for forming a profiled trench and ridge with bridge structure.
Figure 57:
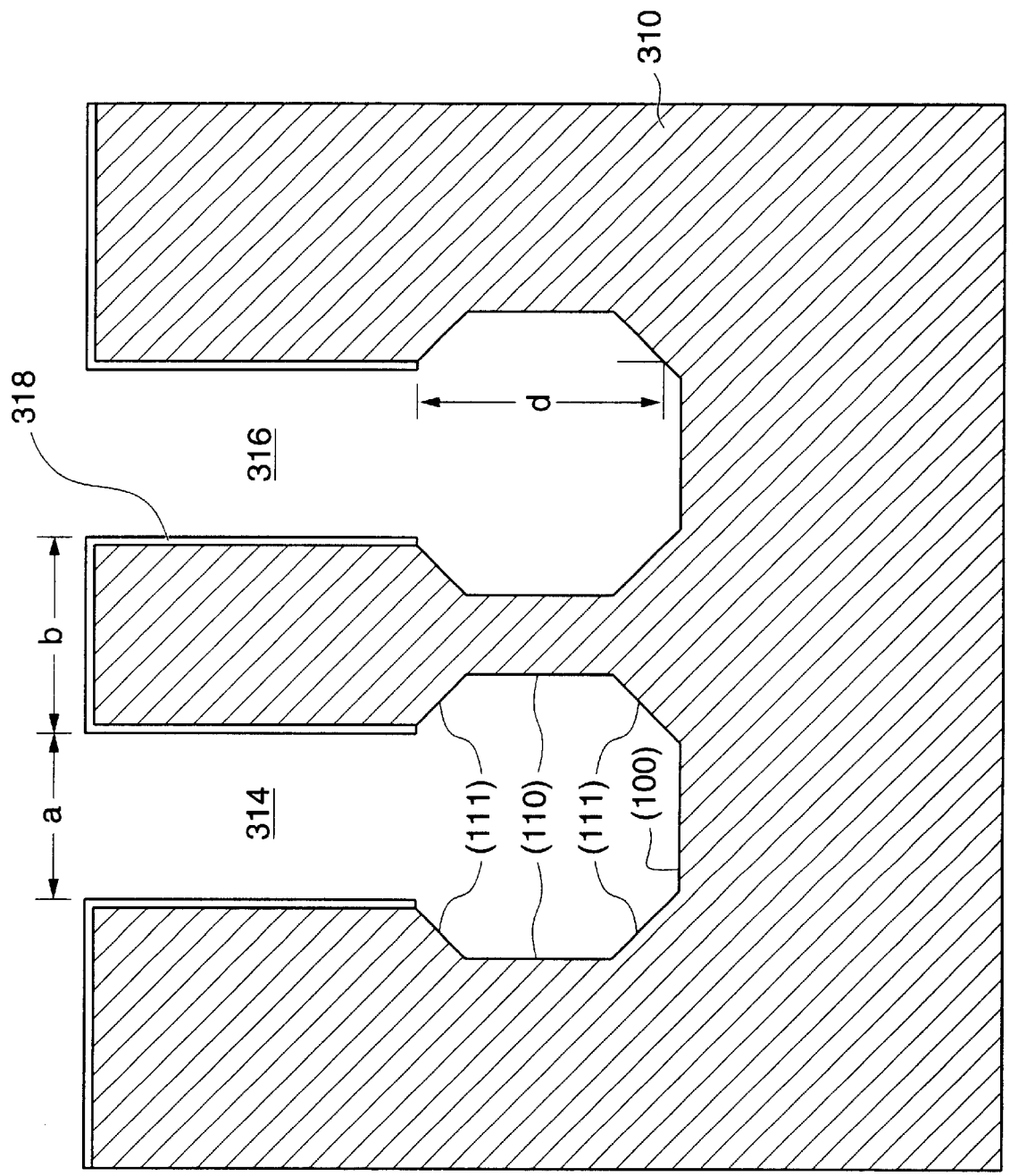
Figure 58:
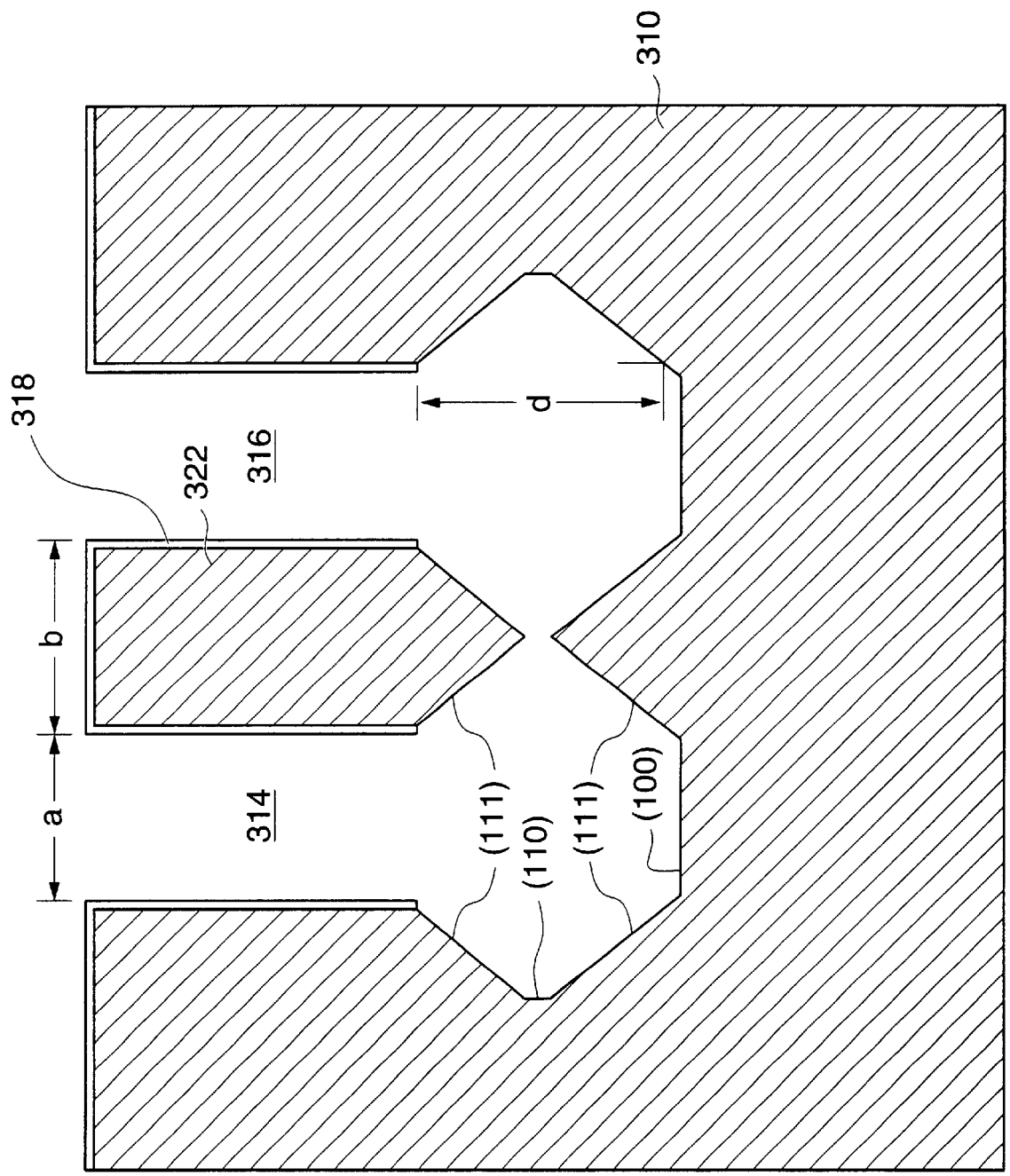

Beginning with a silicon wafer (substrate) (100) orientation as shown in FIG. 56, one conventionally anisotropically (for example, with RIE) etches therein several trenches 314, 316 oriented in the <110>direction. The trenches 314, 316 each have a width a and a mesa having width b located between the two trenches 314, 316. After etching the trenches 314, 316 to depth e (which is non-critical), the trenches 314, 316 are lined (except for their floors) with an etch-resistant (for the following later wet anisotropic etching) mask layer 318, for instance, silicon nitride, and then the trenches are further etched to additional depth d. This is a vertical etch of the type shown for instance in FIG. 42 above. Next in FIG. 57, using the mask layer 318, a wet anisotropic etching starts. One further etches away the bottom parts of the trenches 314, 316 horizontally in the <110>directions and vertically in the <100>directions, as illustrated. Next in FIG. 58 one etches away further, opening more and more (111) planes to achieve the structure shown. In this case the etching is sufficient so as to break through the remaining wall structure between the two trench bottoms, thus defining a bridge structure 322 of the type illustrated above. This bridge 322 is supported outside the plane of the drawing by the wafer 310.

Figure 59:
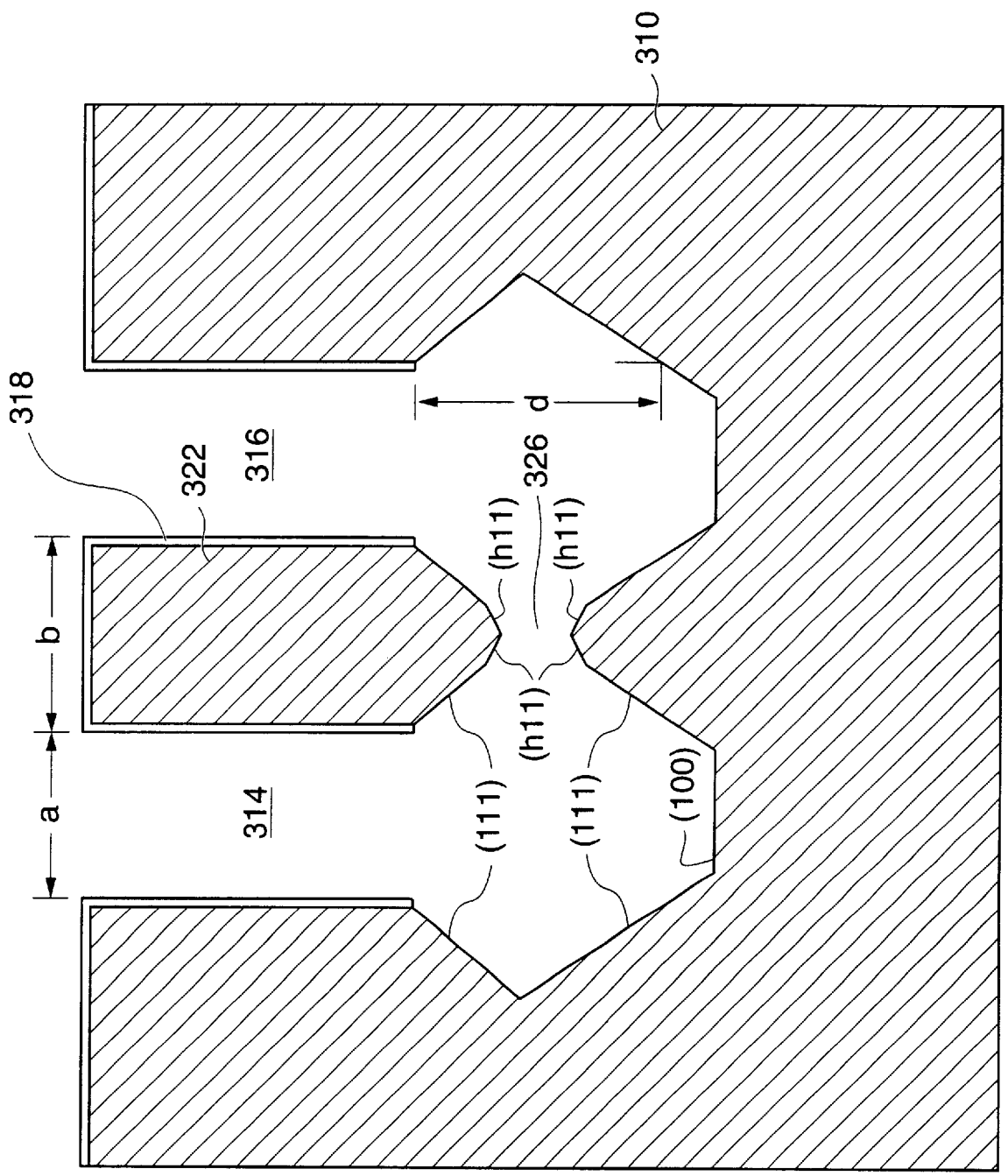

Next as shown in FIG. 59 the opening 326 is further enlarged by etching along the (h11) planes (where h is 1/4; 1/3; 1/2; 2, 3, 4, depending on the specific etching regime) to further open up and better define the bridge 322.

Figure 60:
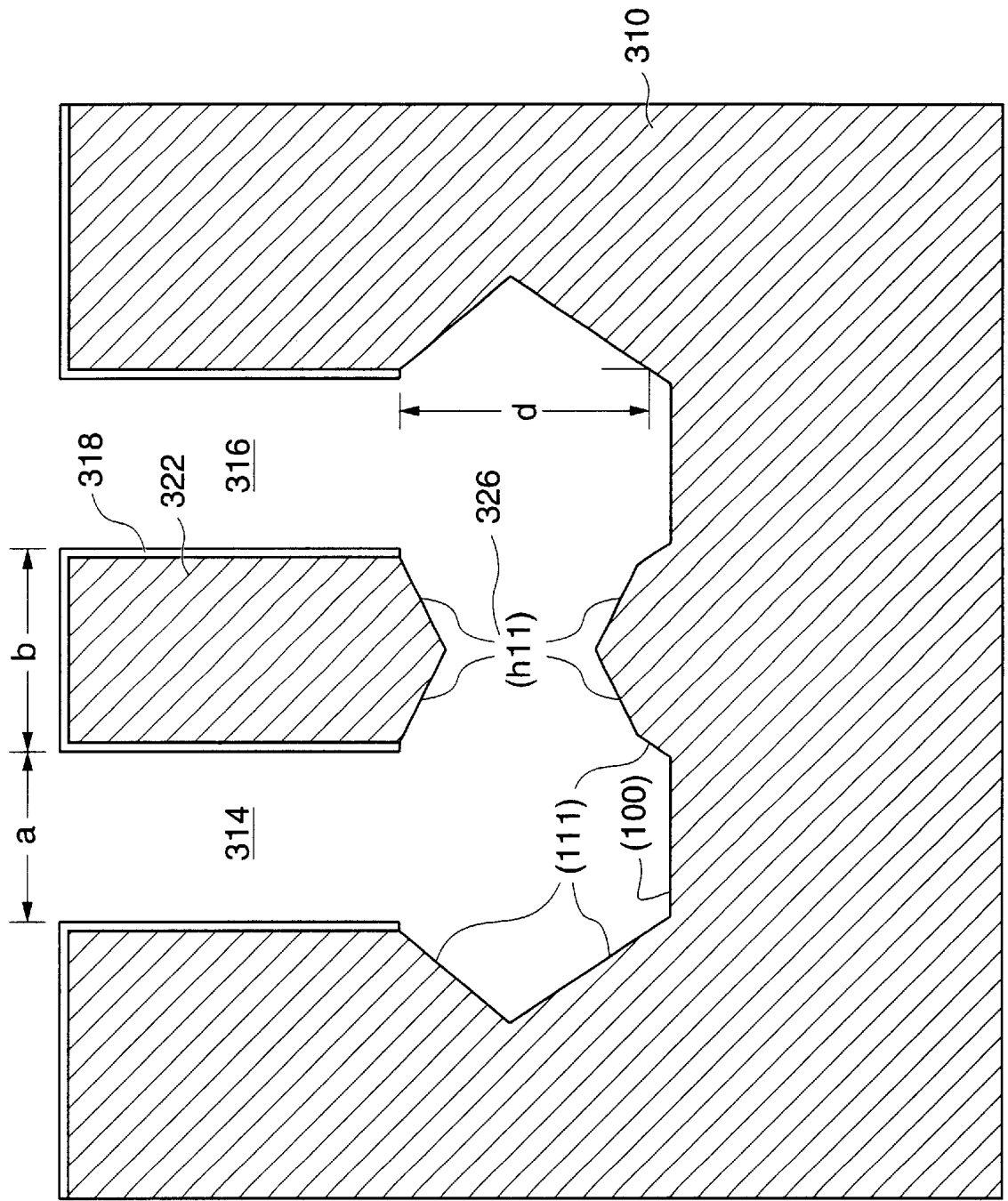

Then in FIG. 60 further etching along the (h11) plane further opens up the opening 326.

Figure 61:
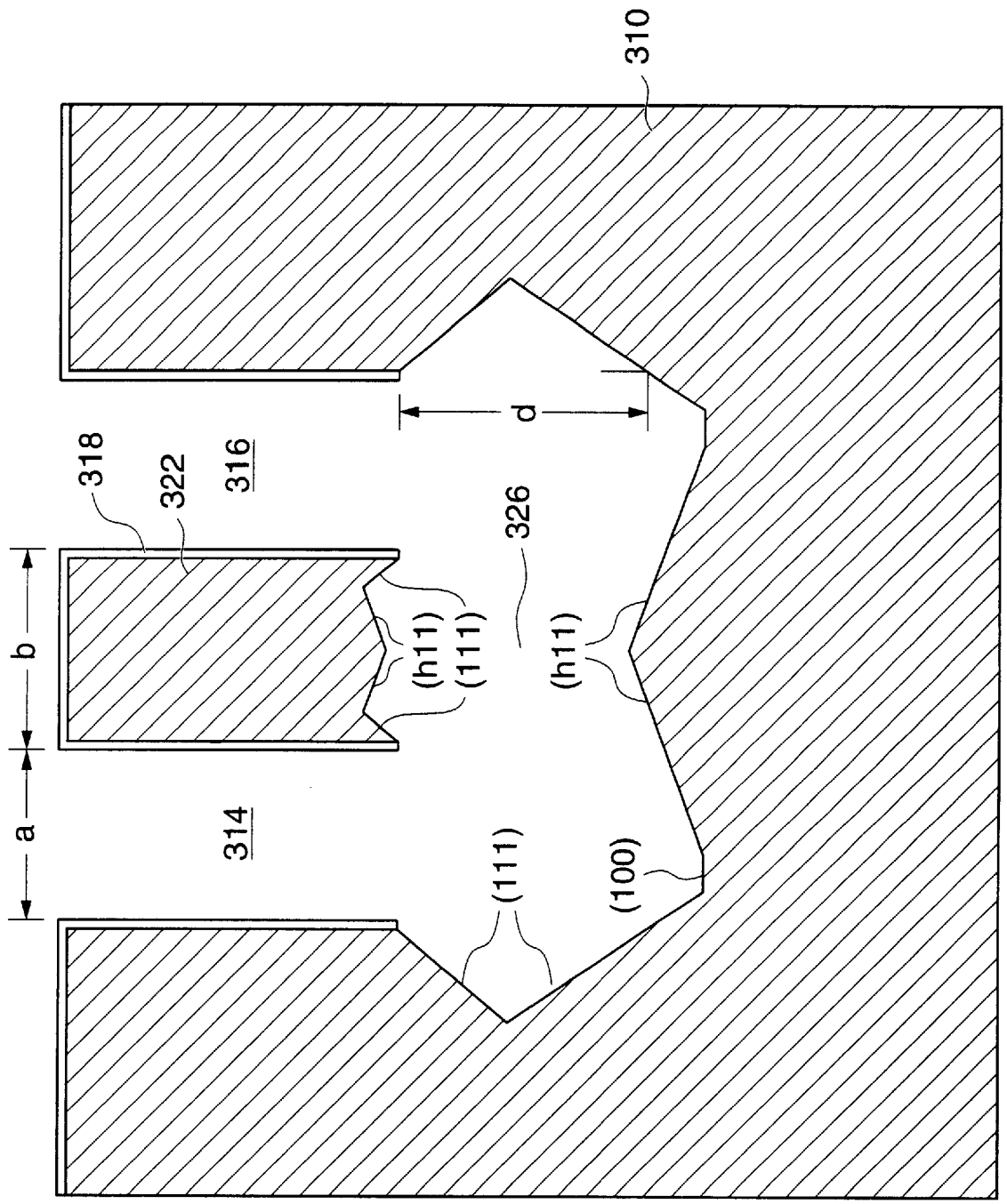
Figure 62:
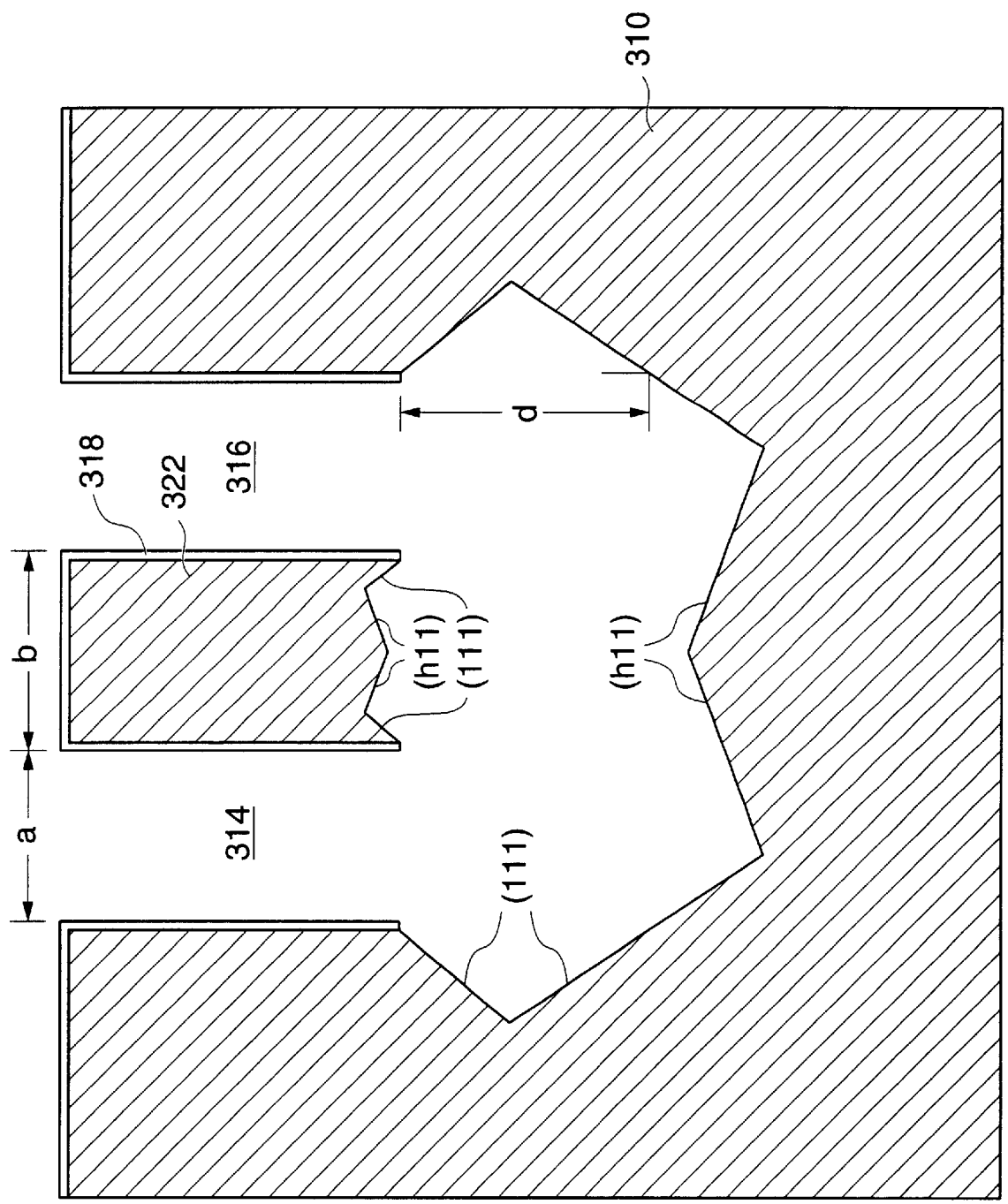

The next step in FIG. 61 is further etching along the (h11) and the (111) planes to widen opening 326 even more. This results in the FIG. 62 structure after further etching along the (100) plane.

Figure 63:
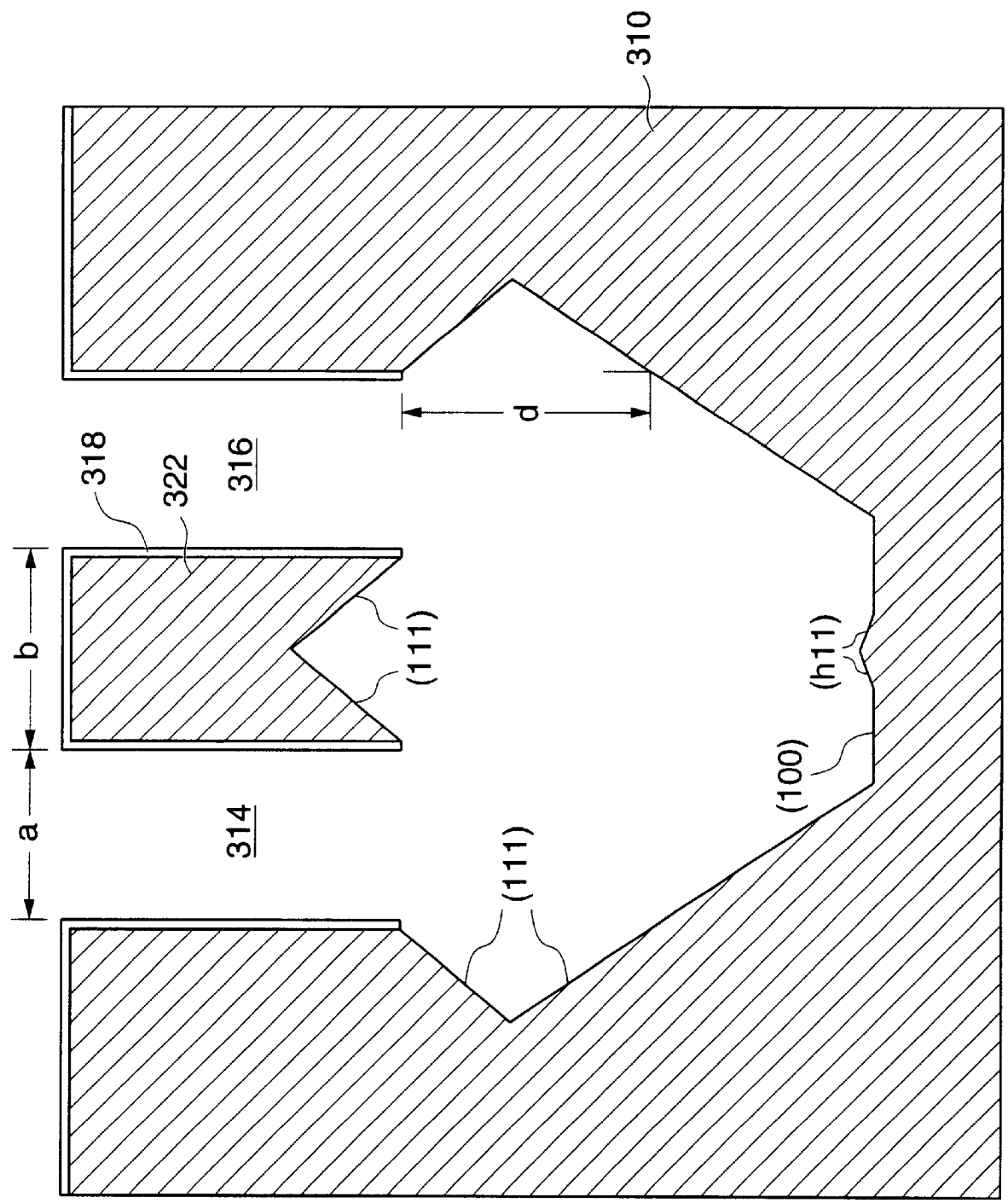

Continuous etching in this fashion results in the FIG. 63 structure due to further etching off the (111) planes. At this stage the bottom of the bridge (h11) is completely defined by the (111) planes, which define a V-groove at the bottom of the bridge.

Figure 64:
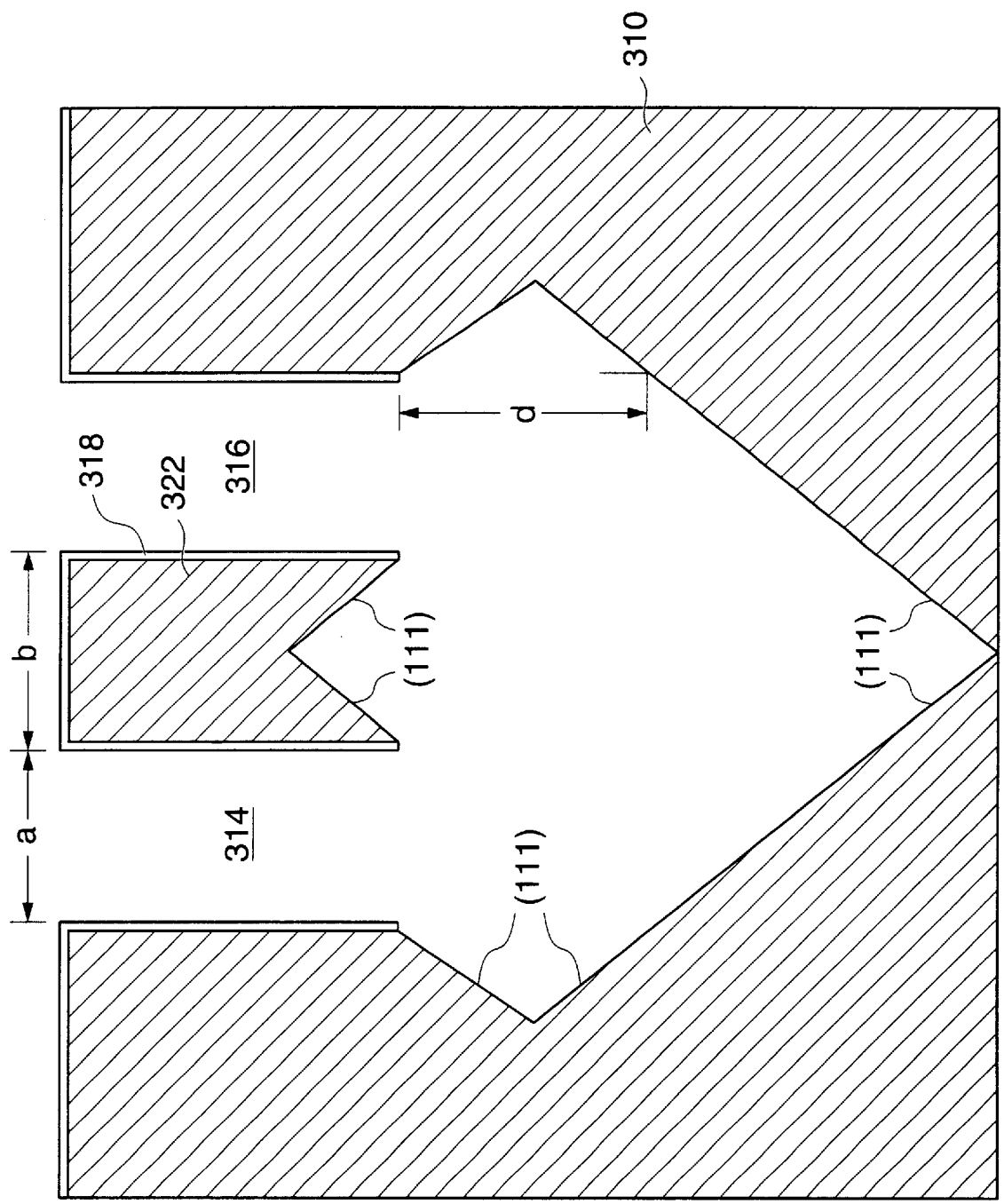

Finally in FIG. 64 the bottom of the opening is etched further to a V shape also at the bottom of the trench along the (111) plane, resulting in the diamond shaped trench of FIG. 64 with the bridge 322.

Figure 65:
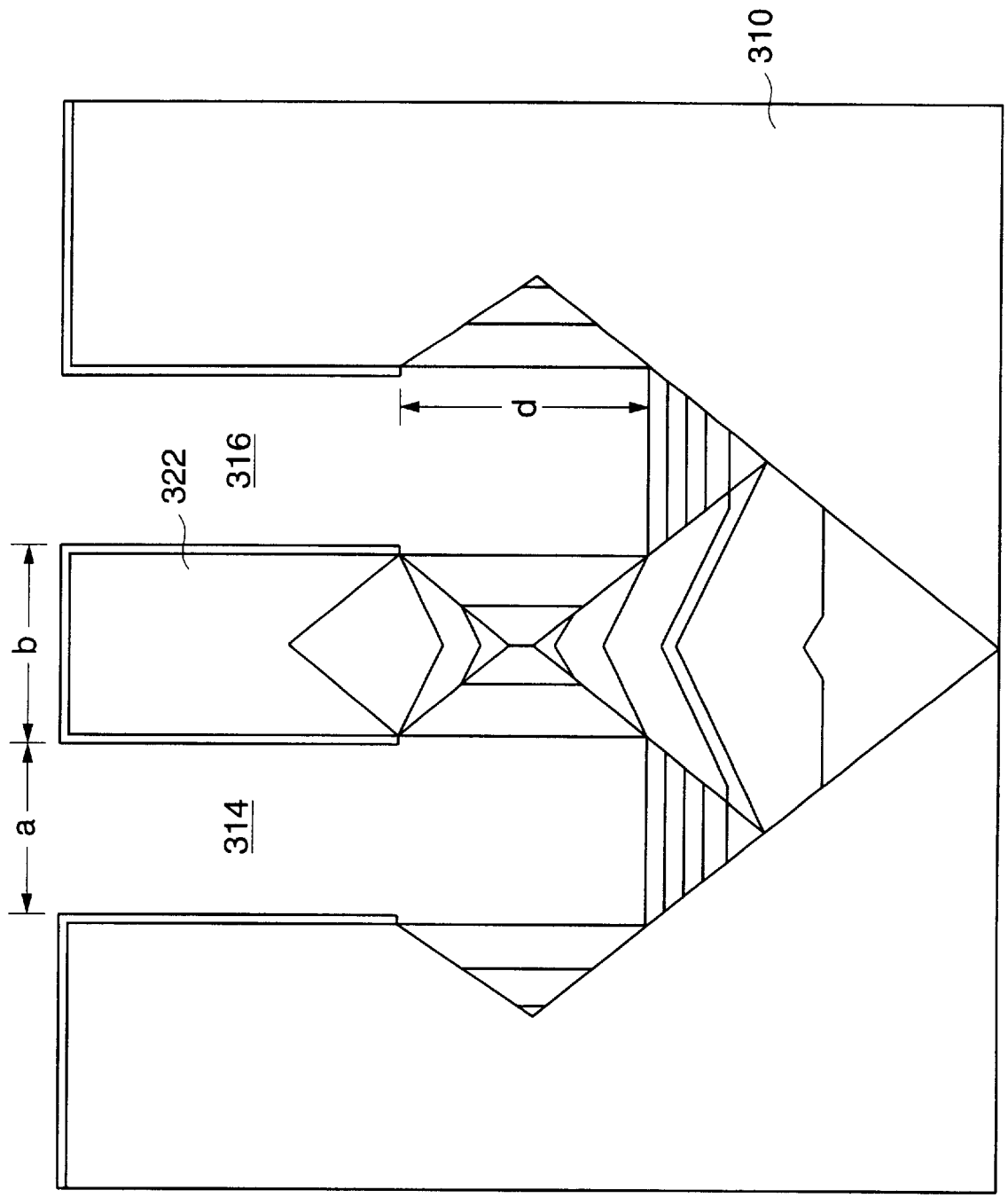

The resulting structures of all these steps is shown in a quasi-perspective view in FIG. 65 showing all of the various facets being etched.

Figure 66:
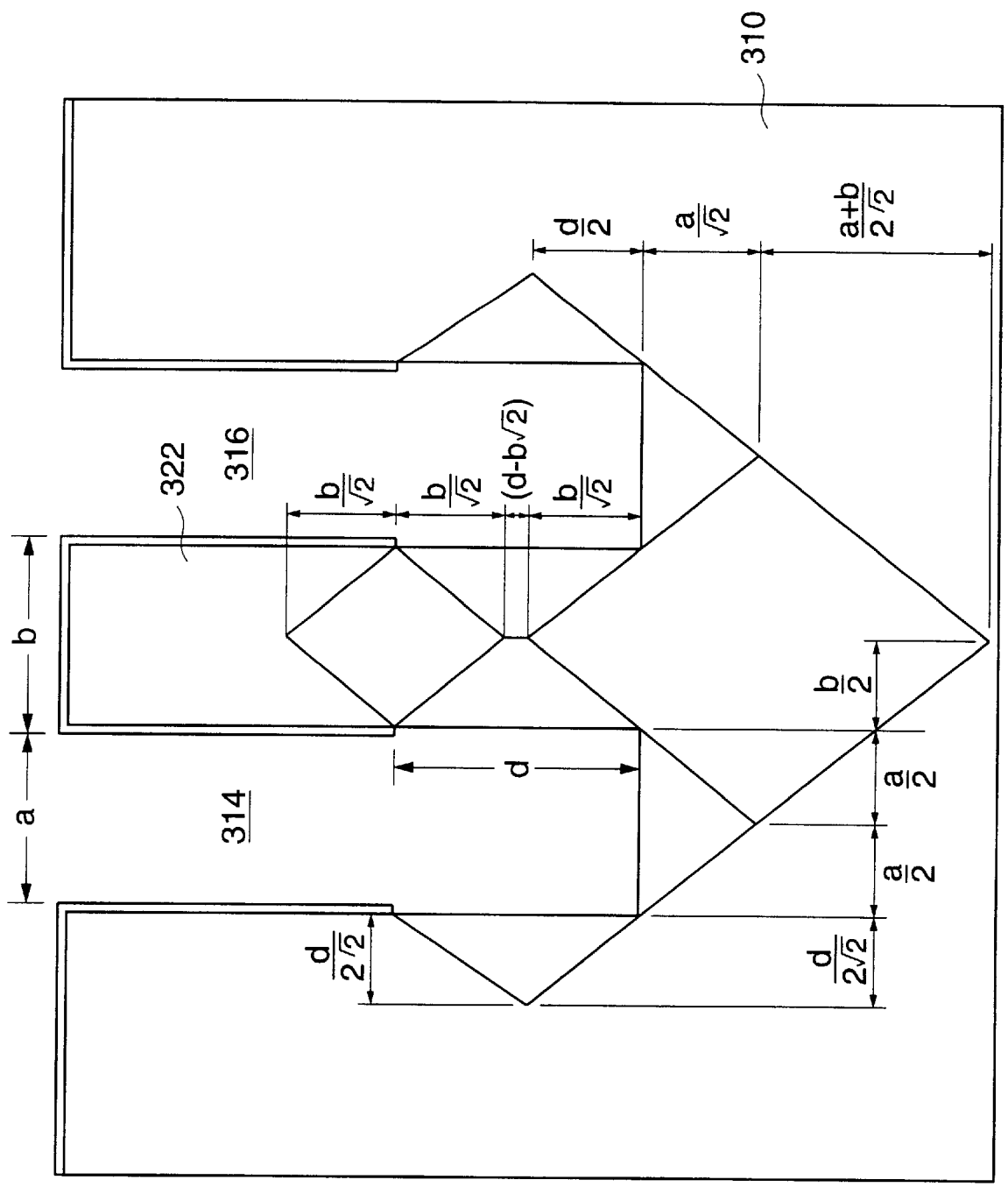

FIG. 66 is the same structure shown in FIGS. 64 and 65 including the various dimensions in terms of the basic dimensions a, b, d and e. Note that the dimension e is not critical for the geometry of the cavity beneath the bridge; it only determines the thickness of the bridge. Thus by selection of the initial dimensions a, b, d and e one selects the dimensions of the trench and bridge. The structures and process steps are used as described above in FIGS. 11b, 15, 19, 27, 29, 45, 46, 47, 49, 50, 51, 54 and 55.

Therefore it can be seen that the bonding process in accordance with this invention uses profiled surfaces and in one embodiment includes the steps of micro profiling the bonding areas on one or both surfaces, depositing bonding material on one or more surfaces, processing the deposited bonding material for instance by temperature, atmospheric pressure, chemical treatment or other means if necessary; patterning the bonding layer on the top of the profiled bonding area if needed; aligning the bonding wafers if necessary; bonding the wafers; thinning and/or separating one of the wafers; and sealing the wafers together if necessary.

The microprofiling which defines the profiled bonding area includes, for instance, a combination of micromachining and deposition of masking layers on sidewalls of the profiled area. The micromachining includes for instance anisotropic etching, wet isotropic etching, RIE, isotropic plasma etching, laser etching, ultrasound etching, sawing, spark erosion, molding, welding, stamping, or any combination of these.

The deposition of the masking layers on the sidewalls of the profiled area is made by for instance oxidation, chemical vapor deposition, sputtering, evaporation, spinning, spraying, epitaxy, electroplating, or any combination of these. The microprofiling of the bonding area to form the microstructures is made by RIE etching first in one embodiment, followed by oxide (or nitride) deposition, then etching the oxide (nitride) on the bottom of the profiled area, then a second RIE etching, and then an anisotropic etching. Of course this is merely exemplary.

When bridge structures are to be formed they are microprofiled in one embodiment by first RIE etching, then oxide (or nitride) deposition, then etching the oxide (or nitride) on the bottom of the profiled area, then a second RIE etching, then anisotropic undercutting.

An alternate way of forming the bridge structures in terms of the microprofiling is first RIE etching, then oxide (or nitride) deposition, then etching the oxide (or nitride) on the bottom of the profile, then a second RIE etching, then anisotropic etching, then a final isotropic undercutting. Such bridge structures or cantilevers are in the general class of beams which of course have uses for other than merely bonding and in fact may be microstructures for instance for use in accelerometers, gyroscopes, and other micromachined devices.

The depositing of the bonding material on one or the other or both of the surfaces to be bonded is made for instance by spinning, spraying, brushing, dipping, dispersing, printing, overall screen printing, or any combination of these. Note that in one embodiment there is no patterning of the bonding layer on top of the profiled bonding area.

The depositing or patterning of the bonding material on the bonding area may be made by contact printing the bonding material to the top surface of the ridges.

The bonding material as initially applied is for instance a liquid (spun on glass, photoresist, polyimide, epoxy or other materials) a suspension (frit glass for instance), or an emulsion, and is deposited by any one of a number of well known methods on an intermediate flat surface (a third substrate) which is brought into contact with a profiled surface of one of the bonding wafers and then the bonding material adheres to the top of the profiled surface. Hence this intermediate flat surface acts as a transfer medium.

In another embodiment, the bonding material in its initial form is a thermoplastic sheet which is brought into contact with the profiled surface of either of the bonding wafers. Then this wafer with the thermoplastic sheet is heated so the thermoplastic sheet material softens and adheres to the top of the profiled surface. The separation of the softened thermoplastic from the remainder of the sheet can be accomplished for instance by additional sharp ridges (acting as knives or cutters) formed around the bonding area to cut this thermoplastic sheet layer out and keep it adhered to the bonding area.

In another embodiment, the bonding material (in its initial form) is a self-adhesive bonding material laid on top of an intermediate (third) substrate (for instance frit glass formed on tape). This third substrate then is brought into contact with a profiled surface of one of the wafers to be bonded and the bonding material adheres under applied pressure to the top of the profiled surface. As above, the separation of the self-adhesive bonding material from the rest of the sheet can be done by additional microprofiled ridges (knife like structures) formed around the bonding area which cut this layer out.

In another embodiment the bonding material (in its initial form) is a liquid (spun on glass, photoresist, polymide, epoxy, etc.) or a suspension (e.g. frit glass) or an emulsion and is deposited on top of the profiled surface by spraying through a shadow mask. Alternatively this liquid bonding material is deposited by screen printing.

In another embodiment the liquid bonding material, as above, is deposited on an intermediate wafer (a third substrate) which is also profiled but has a profile opposite to that of the profiled wafer to be bonded. Any excess bonding material on the flat surface of the third wafer is wiped up or cut out by a knife tool so that the bonding material remains in the trenches in the third wafer which correspond to the microstructure (ridges) on the wafer to be bonded. Then the two wafers (that is the third wafer and the wafer to be bonded) are brought into contact and the bonding material thereby adheres only to the top of the profiled surfaces on the wafer to be bonded.

Another use of liquid bonding material involves first aligning the wafers 12 and 272 shown in FIG. 33 to be bonded and then clamping them, for instance with a mechanical fixture. Then the liquid bonding material 264 is applied (for instance dispensed or spun) into funnels formed in the corners of each die. These funnels are connected with capillaries 266 defined by the microprofiled ridges 268 which are spacers on the bonding area. The capillary is filled in with a liquid bonding material over the surface of the entire wafer. Then the two wafers are annealed and/or cured.

In another version of this process (see FIG. 32) first the two wafers 10 and 12 to be bonded are aligned and temporarily bonded together with bonding material 14. Then the liquid bonding material 264, as described above, is applied (by dispensing or spinning) into funnels define in the corners of each die. These funnels are connected to capillaries 266 defined by ridges 268 which are spacers on the bonding area. The capillaries are filled with the liquid bonding material thereby over the entire surface of the entire wafers to be bonded. Then the wafers are annealed and/or cured.

Note that in any of the above described embodiments, after bonding one (or both) of the bonded wafers can be etched down uniformly to reduce total die thickness. Alternately, after bonding one or both of the bonded wafers can be etched down locally (not uniformly) to define patterns on the top or bottom surfaces of the die. For instance, these patterns may be thermal-mechanical stress buffering elements for mounting the die on the package or to reduce the effective stress on the bonding area during later sawing of the individual bonded structures.

In another embodiment, sealing is performed. In this embodiment (see FIG. 34) after a non-hermetic bonding of the two wafers (280 and 282), on one of the wafers 280 is separated by sawing along line 290. Then a liquid sealing material 292, for instance spun on glass, is applied (by dispensing or spinning) into grooves 290 defined in the top surface of the wafer 280. After the separation cut 290, these grooves are connected to the capillaries 296 defined on the periphery of each die. The capillaries are filled with liquid sealing material 292, for instance, spun on glass, over the entire wafer. Then the bonded wafers are annealed and/or cured.

This disclosure is illustrative and not limiting. Further modifications will be apparent to one skilled in the art in light of this disclosure and are intended to fall within the scope of the appended claims.

I claim:

1. A method of bonding substrates, comprising the acts of:
   etching at least a portion of a principal surface of a first crystalline substrate to define therein at least one microstructure, the microstructure defining at least one cavity;
   bonding with a bonding material the etched portion of the principal surface of the first substrate to a principal surface of a second substrate, during which the bonding material fills the at least one cavity; and
   wherein the bonding comprises the act of depositing the bonding material on the principal surface of at least one of the substrates; and
   patterning the deposited bonding material prior to the bonding.

2. The method of claim 1, further comprising the act of etching at least a portion of the principal surface of the second substrate prior to the bonding.

3. The method of claim 1, wherein the bonding includes the act of processing the bonding material.

4. The method of claim 1, further comprising the act of aligning the first and second substrate one to another prior to the bonding.

5. A method of bonding substrates, comprising the acts of:
   etching at least a portion of a principal surface of a first crystalline substrate to define therein at least one microstructure, the microstructure defining at least one cavity;
   bonding with a bonding material the etched portion of the principal surface of the first substrate to a principal surface of a second substrate, during which the bonding material fills the at least one cavity; and
   further comprising the act of reducing a thickness of one of the substrates after the bonding.

6. A method of bonding substrates, comprising the acts of:
   etching at least a portion of a principal surface of a first crystalline substrate to define therein at least one microstructure, the microstructure defining at least one cavity;
   bonding with a bonding material the etched portion of the principal surface of the first substrate to a principal surface of a second substrate, during which the bonding material fills the at least one cavity; and
   further comprising the act of sealing at least a portion of the first and second substrates together.

7. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the etching includes a combination of micromachining and depositing masking layers on side walls of the microstructure.

8. The method of claim 7, wherein the micromachining is selected from the group consisting of anisotropic etching, wet isotropic etching, RIE, isotropic plasma etching, laser etching, ultrasound etching, sawing, spark erosion, molding, welding, stamping, and a combination thereof.

9. The method of claim 7, wherein the depositing the masking layers is selected from the group consisting of oxidation, chemical vapor deposition, sputtering, evaporation, spinning, spraying, epitaxy, soldering, electroplating, and a combination thereof.

10. A method of bonding substrates, comprising the acts of:
    etching at least a portion of a principal surface of a first crystalline substrate to define therein at least one microstructure, the microstructure defining at least one cavity; and
    bonding with a bonding material the etched portion of the principal surface of the first substrate to a principal surface of a second substrate, during which the bonding material fills the at least one cavity;
    wherein the etching includes the acts of RIE etching first, then oxide or nitride deposition, then etching the oxide or nitride on a bottom of the microstructure, then a second RIE etching, then anisotropic etching.

11. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the microstructure is a bridge and the etching includes the acts of RIE etching first, then oxide or nitride deposition, then etching the oxide or nitride on a bottom of the microstructure, then a second RIE etching, then anisotropic undercutting.

12. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the microstructure is a bridge and the etching includes the acts of RIE etching first, then oxide or nitride deposition, then etching the oxide or nitride on a bottom of the microstructure, then a second RIE etching, then anisotropic etching, then isotropic undercutting.

13. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the microstructure is a beam.

14. The method of claim 1, wherein the depositing is selected from the group consisting of spraying, brushing, dipping, dispersing, printing, screen printing, and any combination thereof.

15. The method of claim 1, wherein there is no patterning of the bonding material overlying at least part of the microstructure.

16. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the bonding comprises the act of depositing the bonding material on the principal surface of at least one of the substrates; and
   wherein the depositing includes the act of contact printing the bonding material to a surface of the microstructure.

17. The method of claim 1, wherein the bonding material is selected from the group consisting of a liquid, a suspension, and an emulsion, and further comprising the act of depositing the bonding material on a surface which is brought into contact with the microstructure, and wherein the bonding material adheres to a top of the microstructure.

18. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the bonding comprises the act of depositing the bonding material on the principal surface of at least one of the substrates; and
   wherein the bonding material is a thermoplastic sheet which is brought into contact with the microstructure, further comprising the act of heating the thermoplastic so it adheres to a top of the microstructure.

19. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the bonding comprises the act of depositing the bonding material on the principal surface of at least one of the substrates; and
   wherein the bonding material is a self adhesive bonding material on a third substrate and further comprising the act of bringing the third substrate into contact with the microstructure thereby to deposit the bonding material.

20. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;
   wherein the bonding comprises the act of depositing the bonding material on the principal surface of at least one of the substrates; and
   wherein the bonding material is selected from the group consisting of a liquid, a suspension, and an emulsion and further comprising the act of depositing the bonding material by spraying it through a mask.

21. A method of bonding substrates, comprising the acts of:
   etching at least a portion of a principal surface of a first crystalline substrate to define therein at least one microstructure, the microstructure defining at least one cavity; and
   bonding with a bonding material the etched portion of the principal surface of the first substrate to a principal surface of a second substrate, during which the bonding material fills the at least one cavity;

wherein the bonding comprises the act of depositing the bonding material on the principal surface of at least one of the substrates; and wherein the bonding material is selected from the group consisting of a liquid, a suspension, and an emulsion and further comprising the act of depositing the bonding material by screen printing.

22. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the bonding comprises the act of depositing the bonding material on the principal surface of at least one of the substrates; and wherein the bonding material is selected from the group consisting of a liquid, a suspension, and an emulsion and defines a profile opposite to a profile of the microstructure on the bonding wafer.

23. The method of claim 4, further comprising after the aligning, the act of clam ping the substrates and wherein the bonding material is applied to voids in one of the substrates.

24. A method of bonding substrates, comprising the acts of:

etching at least a portion of a principal surface of a first crystalline substrate to define therein at least one microstructure, the microstructure defining at least one cavity;

bonding with a bonding material the etched portion of the principal surface of the first substrate to a principal surface of a second substrate, during which the bonding material fills the at least one cavity; and aligning the first and second substrate one to another prior to the bonding;

wherein after the aligning, the substrates are temporarily bonded together;

further comprising the act of applying sealing material to edges of the substrates via voids defined in at least one of the substrates.

25. A method of bonding substrates, comprising the acts of:

etching at least a portion of a principal surface of a first crystalline substrate to define therein at least one microstructure, the microstructure defining at least one cavity;

bonding with a material the etched portion of the principal surface of the first substrate to a principal surface of a second substrate, during which the bonding material fills the at least one cavity; and further comprising after the bonding, the act of etching one of the substrates uniformly to reduce a total thickness of the bonded structure.

26. The method of claim 1, further comprising after the bonding, the act of etching one of the substrates locally to define patterns.

27. A method of bonding substrates, comprising the acts of:

etching at least a portion of a principal surface of a first crystalline substrate to define therein at least one microstructure, the microstructure defining at least one cavity;

bonding with a bonding material the etched portion of the principal surface of the first substrate to a principal surface of a second substrate, during which the bonding material fills the at least one cavity;

sealing at least a portion of the first and second substrates together; and further comprising after the bonding, the act of applying sealing material to edges of at least one of the substrates via voids defined in the substrate.

28. The method of claim 1, wherein the bonding material is selected from a group consisting of solder metals, glass materials, and polymers.

29. The method of claim 1, wherein the microstructure is selected from a group consisting of trenches, ridges, pyramids, poles, and cavities.

30. The method of claim 1, wherein the first substrate defines in its principal surface a plurality of microstructures.

31. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein a sidewall of the microstructure has a negative slope relative to a plane defined by the principal surface of the first substrate.

32. The method of claim 1, wherein the microstructure is selected from a group consisting of V-shaped, U-shaped, keyhole-shaped, and diamond-shaped microstructures.

33. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the principal surface of the second substrate defines at least one microstructure filled by the bonding material.

34. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the second substrate defines a plurality of microstructures which are each a ridge, each ridge extending from the second substrate into the bonding material in a trench in the first substrate.

35. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the first and second substrates each define a plurality of microstructures for bonding, and each of the microstructures on the first substrate extends into a corresponding microstructure on the second substrate.

36. The method of claim 35, wherein each microstructure in the first substrate is a ridge that defines a neck portion and a wider end portion distal of the neck portion, and the end portion of each ridge on the first substrate interlocks with the end portion of a corresponding microstructure for bonding on the second substrate.

37. A method of bonding substrates, comprising the acts of:

etching at least a portion of a principal surface of a first crystalline substrate to define therein at least one microstructure, the microstructure defining at least one cavity;

bonding with a bonding material the etched portion of the principal surface of the first substrate to a principal surface of a second substrate, during which the bonding material fills the at least one cavity; and further comprising the act of forming an electrically conductive trace at a principal surface of the first or second substrate and extending beyond an edge of the bonding material.

38. The method of claim 36, wherein the conductive trace is formed of metal.

39. The method of claim 37, wherein the conductive trace is formed of one of polysilicon or a doped region of the first or second substrate.

40. The method of claim 37, wherein the bonding material defines a bonding ring in a plane lying parallel to that of the principal surface of the first substrate, and the conductive trace is formed extending along a length of a portion of the bonding ring.

41. The method of claim 39, further comprising the act of forming a metallized area on a portion of the conductive trace.

42. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the first substrate defines at least one spacer extending towards and in contact with the principal surface of the second substrate, thereby to define a particular distance between the first and second substrates and a thickness of the bonding layer fills in the cavity in the microstructures.

43. The method of claim 42, wherein the spacer is at an edge of the bonded structure, and further comprising forming a sealant lying on an outer surface of the first and second substrates at the edge.

44. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the first substrate defines a cavity extending therethrough to the principal surface of the second substrate and further comprising the act of forming a sealant lying on a side surface of the cavity and on a portion of the principal surface of the second substrate that is in communication with the cavity.

45. The method of claim 44, wherein the first substrate further defines a capillary opening in communication with the cavity, and the sealant is formed extending into the capillary opening.

46. The method of claim 45 wherein the first substrate defines a capillary opening at the edge, and the sealant extends into the capillary opening.

47. The method of claim 1, wherein one of the first or second substrates further defines at least one structure selected from a group consisting of micro-sensors, micro-actuators, micro-machined structures, and micro-electronic and micro-electro-mechanical devices.

48. The method of claim 1, wherein the structure is a single die.

49. The method of claim 1, wherein the second substrate is selected from the group consisting of crystalline silicon, metal, glass, ceramic or plastic.

50. A method of bonding substrates, comprising the acts of:

etching at least a portion of a principal surface of a first crystalline substrate to define therein at least one microstructure, the microstructure defining at least one cavity; and bonding with a bonding material the etched portion of the principal surface of the first substrate to a principal surface of a second substrate, during which the bonding material fills the at least one cavity;

wherein the at least one microstructure has a vertical dimension of less than 15 $\mu$m, and a horizontal dimension of less than 5 $\mu$m, relative to the principal surface of the first substrate.

* * * * *